United States Patent
Maekawa et al.

(10) Patent No.: US 11,791,125 B2
(45) Date of Patent: Oct. 17, 2023

(54) ABERRATION CORRECTOR

(71) Applicant: NuFlare Technology, Inc., Yokohama (JP)

(72) Inventors: Yuichi Maekawa, Sagamihara (JP); Kazuhiko Inoue, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 137 days.

(21) Appl. No.: 17/456,917

(22) Filed: Nov. 30, 2021

(65) Prior Publication Data
US 2022/0189728 A1 Jun. 16, 2022

(30) Foreign Application Priority Data
Dec. 15, 2020 (JP) ................................. 2020-207702

(51) Int. Cl.
*H01J 37/153* (2006.01)
*H01J 37/09* (2006.01)

(52) U.S. Cl.
CPC ............ *H01J 37/153* (2013.01); *H01J 37/09* (2013.01); *H01J 2237/0453* (2013.01); *H01J 2237/1534* (2013.01)

(58) Field of Classification Search
CPC .. H01J 37/153; H01J 37/09; H01J 2237/0453; H01J 2237/1534
See application file for complete search history.

(56) References Cited

U.S. PATENT DOCUMENTS

2020/0395189 A1  12/2020  Inoue et al.

FOREIGN PATENT DOCUMENTS

| JP | 2008-041870 A | 2/2008 |
| JP | 2020-205160 A | 12/2020 |

OTHER PUBLICATIONS

Combined Taiwanese Office Action and Search Report dated Dec. 5, 2022 in Taiwanese Patent Application No. 110144245 (with unedited computer generated English translation), 9 pages.

*Primary Examiner* — Nicole M Ippolito
*Assistant Examiner* — Hanway Chang
(74) *Attorney, Agent, or Firm* — Oblon, McClelland, Maier & Neustadt, L.L.P.

(57) ABSTRACT

According to one aspect of the present invention, an aberration corrector includes a first electrode substrate provided with first passage holes through which multiple electron beams pass; a second electrode substrate disposed below the first electrode substrate and provided with second passage holes through which the multiple electron beams pass, first electrodes of four or more poles being disposed individually on each top surface region of top surface regions around some second passage holes among the second passage holes; and a third electrode substrate disposed below the second electrode substrate and provided with third passage holes through which the multiple electron beams pass, second electrodes of four or more poles being disposed individually on each of top surface region of top surface regions around some third passage holes corresponding to remaining second passage holes in which the first electrodes are not disposed, among the third passage holes.

10 Claims, 20 Drawing Sheets

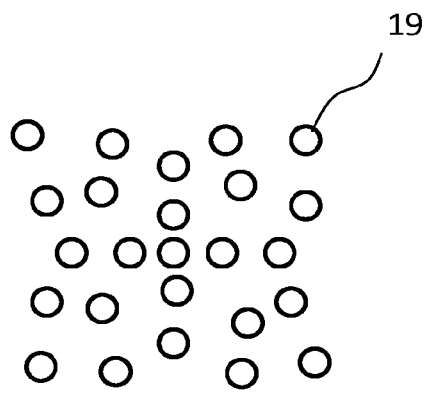
FIG.11A
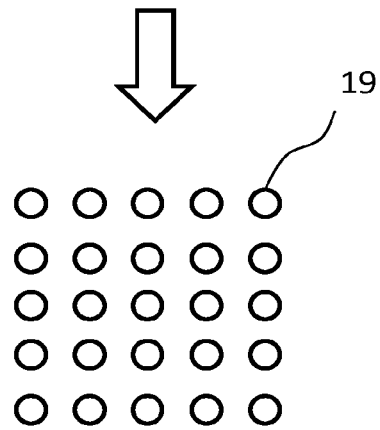
FIG.11B
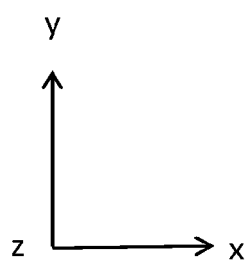

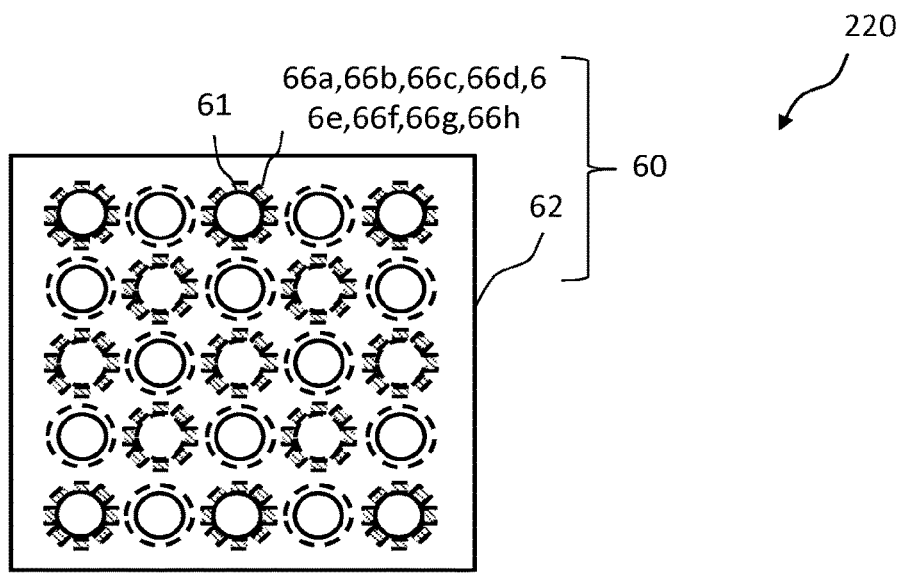
FIG.17A
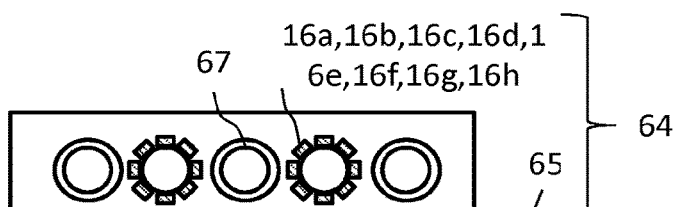
FIG.17B
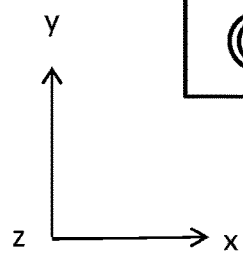

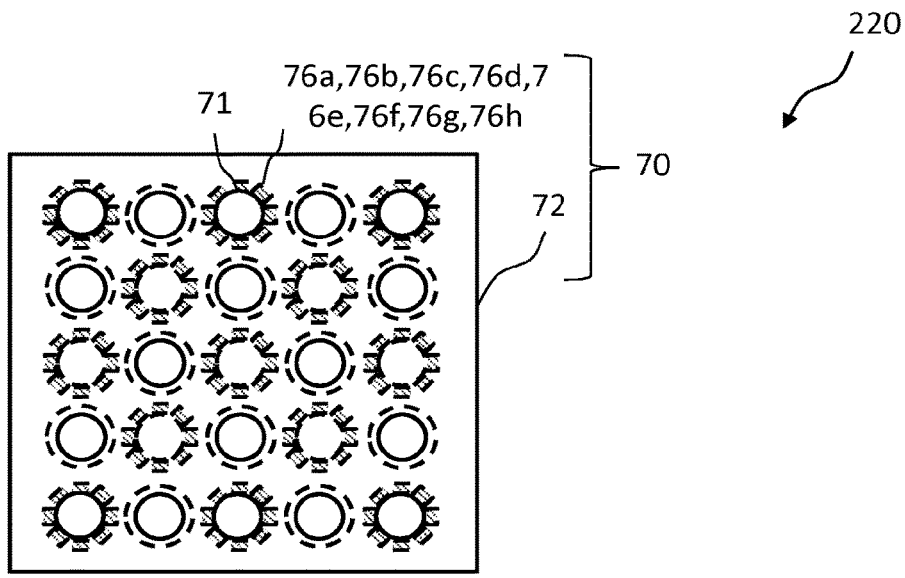
FIG.19A
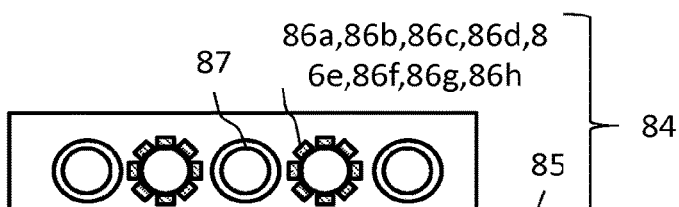
FIG.19B
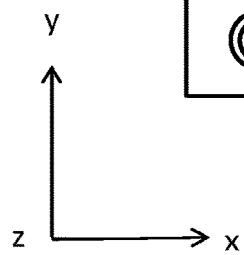

ABERRATION CORRECTOR

CROSS-REFERENCE TO RELATED APPLICATION

This application is based upon and claims the benefit of priority from prior Japanese Patent Application No. 2020-207702 filed on Dec. 15, 2020 in Japan, the entire contents of which are incorporated herein by reference.

BACKGROUND OF THE INVENTION

Field of the Invention

The present invention relates to an aberration corrector. For example, the present invention relates to an aberration corrector that is used in a multipole lens array correcting aberrations of multiple electron beams and an apparatus emitting the multiple electron beams.

Related Art

Recently, with an increase in the degree of integration and an increase in the capacity of a large-scale integrated circuit (LSI), a circuit line width required for a semiconductor element decreases. Further, improvement of a yield is indispensable for manufacturing the LSI requiring a large manufacturing cost. However, as represented by a 1-Gbit random access memory (DRAM), patterns configuring the LSI are on the order of submicron to nanometer. In recent years, with the miniaturization of a dimension of an LSI pattern formed on a semiconductor wafer, a dimension to be detected as a pattern defect is also extremely small. Therefore, it is necessary to improve accuracy of a pattern inspection apparatus for inspecting a defect of an ultrafine pattern transferred to the semiconductor wafer.

As an inspection method, a method of performing inspection by comparing a measurement image obtained by imaging a pattern formed on a substrate, such as a semiconductor wafer or a lithography mask, with design data or a measurement image obtained by imaging the same pattern on the substrate is known. For example, as a pattern inspection method, there are a "die to die inspection" for comparing measurement image data obtained by imaging the same patterns at different places on the same substrate with each other and a "die to database inspection" for generating design image data (reference image) on the basis of pattern-designed design data and comparing the design image data with a measurement image to be measurement data obtained by imaging a pattern. The imaged image is sent as the measurement data to a comparison circuit. In the comparison circuit, after positions of the images are adjusted, the measurement data and the reference data are compared according to an appropriate algorithm. When the measurement data and the reference data are not matched, it is determined that there is a pattern defect.

In the pattern inspection apparatus described above, in addition to development of an apparatus that irradiates an inspection target substrate with a laser beam and images a transmitted image or a reflected image, development of an inspection apparatus that scans the inspection target substrate with an electron beam, detects secondary electrons emitted from the inspection target substrate according to irradiation of the electron beam, and acquires a pattern image is also advanced. In the inspection apparatus using the electron beam, development of an apparatus using multiple beams is also advanced. In an electron optical system using multiple beams, aberrations such as off-axis astigmatism and distortion (distortion aberration) may occur. In the inspection apparatus using the electron beam, it is necessary to acquire a highly accurate image in order to perform inspection. In order to correct the aberration, it is necessary to individually correct an orbit of each beam of the multiple beams. For example, each beam-independent multipole lens may be disposed in an array.

Here, in order to dispose the multipole lens in an array, it is necessary to dispose each wiring connected to multipoles for each beam on a substrate. However, when the number of beams increases while an inter-beam pitch is narrow, it is difficult to dispose a plurality of wirings connected to the multipoles for each beam on the substrate due to a wiring space. For this reason, although it is conceivable to form a multilayer wiring in the substrate on which the multipoles are disposed, the multilayer wiring has a problem that a wiring defect such as a contact defect with an electrode or a wiring disconnection defect is likely to occur.

Here, a deflector array in which a blanking deflector array including two-pole electrodes is dispersed on two substrates, and the two electrode substrates are sandwiched between two wiring substrates on which a multilayer wiring is formed to contact each electrode is disclosed (see JP-A-2008-041870, for example).

BRIEF SUMMARY OF THE INVENTION

According to one aspect of the present invention, an aberration corrector includes:

a first electrode substrate provided with a plurality of first passage holes through which multiple electron beams pass, a shield electrode being disposed on inner walls of the plurality of first passage holes;

a second electrode substrate disposed below the first electrode substrate and provided with a plurality of second passage holes through which the multiple electron beams pass, a shield electrode being disposed on inner walls of the plurality of second passage holes, a plurality of first electrodes of four or more poles being disposed individually on each top surface region of top surface regions around some second passage holes among the plurality of second passage holes; and a third electrode substrate disposed below the second electrode substrate and provided with a plurality of third passage holes through which the multiple electron beams pass, a plurality of second electrodes of four or more poles being disposed individually on each of top surface region of top surface regions around some third passage holes corresponding to remaining second passage holes in which the plurality of first electrodes are not disposed, among the plurality of third passage holes, wherein the some second passage holes in which the plurality of first electrodes are disposed are formed to have a first hole diameter, and some first passage holes located above the some second passage holes among the plurality of first passage holes of the first electrode substrate are formed to have a second hole diameter from a top surface of the first electrode substrate to a middle toward a back surface of the first electrode substrate and to have a third hole diameter larger than the first and second hole diameters from the middle to the back surface of the first electrode substrate, and the some third passage holes in which the plurality of second electrodes are disposed are formed to have the first hole diameter, and remaining second passage holes located above the some third passage holes among the plurality of second passage holes of the second electrode substrate are formed to have the second hole diameter from a top surface of the second electrode substrate to a middle toward a back surface of the second electrode substrate and to have the third hole diameter larger than the first and second hole diameters from the middle to the back surface of the second electrode substrate.

According to another aspect of the present invention, an aberration corrector includes:

a first electrode substrate provided with a plurality of first passage holes through which multiple electron beams pass, a plurality of first electrodes of four or more poles being disposed individually on each back surface region of back surface regions around some first passage holes among the plurality of first passage holes; and a second electrode substrate disposed below the first electrode substrate and provided with a plurality of second passage holes through which the multiple electron beams pass, a plurality of second electrodes of four or more poles being disposed individually on each top surface region of top surface regions around some second passage holes corresponding to remaining first passage holes in which the plurality of first electrodes are not disposed, among the plurality of second passage holes.

BRIEF DESCRIPTION OF THE DRAWINGS

FIGS. 11A and 11B are diagrams showing an example of a distortion aberration (distortion) in the first embodiment;

FIGS. 17A and 17B are top views showing an example of a configuration of each electrode substrate of an aberration corrector in a second embodiment;

FIGS. 19A and 19B are top views showing an example of a configuration of each of first and third electrode substrates of an aberration corrector in a third embodiment.

DETAILED DESCRIPTION OF THE INVENTION

Hereinafter, in embodiments, an aberration corrector in which multipole lenses for multiple electron beams capable of reducing wiring defects are disposed in an array will be described.

In the following embodiments, a multiple electron beam inspection apparatus will be described as an example of a multiple electron beam irradiation apparatus. However, the multiple electron beam irradiation apparatus is not limited to the inspection apparatus, and may be a writing apparatus or the like, for example, an apparatus that emits multiple electron beams using an electron optical system.

First Embodiment

Figure 1:
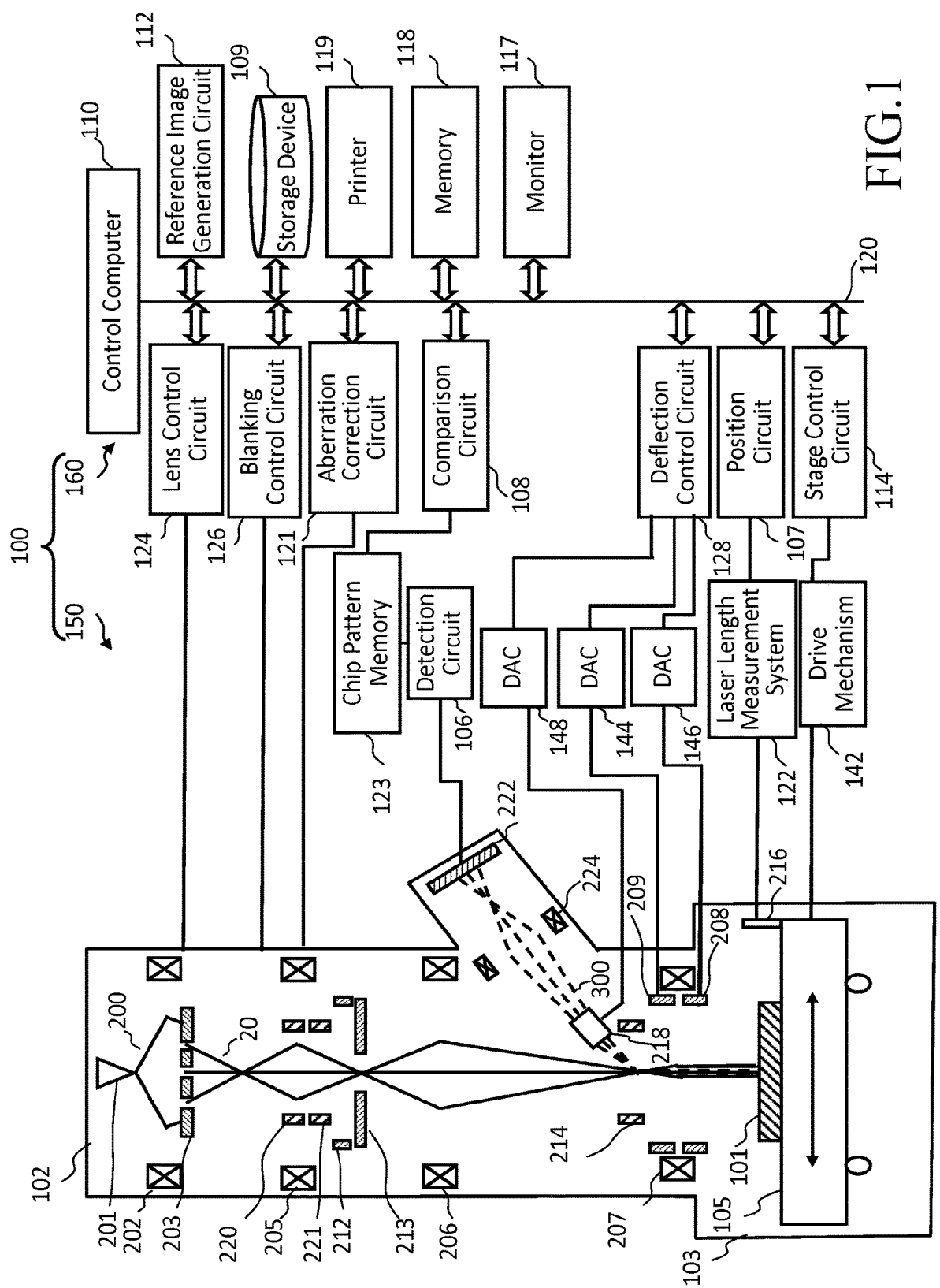
FIG. 1 is a configuration diagram showing a configuration of a pattern inspection apparatus in a first embodiment.

FIG. 1 is a configuration diagram showing a configuration of a pattern inspection apparatus in a first embodiment. In FIG. 1, an inspection apparatus 100 to inspect a pattern formed on a substrate is an example of a multiple electron beam inspection apparatus. The inspection apparatus 100 includes an image acquisition mechanism 150 and a control system circuit 160. The image acquisition mechanism 150 has an electron beam column 102 (electron lens barrel) and an inspection chamber 103. In the electron beam column 102, an electron gun assembly 201, an electromagnetic lens 202, a shaping aperture array substrate 203, an electromagnetic lens 205, an aberration corrector 220, an electrostatic lens array 221, a collective blanking deflector 212, a limit aperture substrate 213, an electromagnetic lens 206, an electromagnetic lens 207 (objective lens), a main deflector 208, a sub-deflector 209, a beam separator 214, a deflector 218, an electromagnetic lens 224, and a multi-detector 222 are disposed. The electron gun assembly 201, the electromagnetic lens 202, the shaping aperture array substrate 203, the electromagnetic lens 205, the aberration corrector 220, the electrostatic lens array 221, the collective blanking deflector 212, the limit aperture substrate 213, the electromagnetic lens 206, the electromagnetic lens 207 (objective lens), the main deflector 208, and the sub-deflector 209 configure a primary electron optical system. In addition, the electromagnetic lens 207, the beam separator 214, the deflector 218, and the electromagnetic lens 224 configure a secondary electron optical system.

In the inspection chamber 103, a stage 105 to be movable in at least X and Y directions is disposed. On the stage 105, a substrate 101 (target object) to be inspected is disposed. The substrate 101 includes a mask substrate for exposure and a semiconductor substrate such as a silicon wafer. When the substrate 101 is the semiconductor substrate, a plurality of chip patterns (wafer dies) are formed on the semiconductor substrate. When the substrate 101 is the mask substrate for exposure, a chip pattern is formed on the mask substrate for exposure. The chip pattern is configured by a plurality of figure patterns. A plurality of chip patterns (wafer dies) are formed on the semiconductor substrate by exposing and transferring the chip pattern formed on the mask substrate for exposure to the semiconductor substrate a plurality of times. Hereinafter, a case where the substrate 101 is the semiconductor substrate will be mainly described. The substrate 101 is disposed on the stage 105 with a pattern formation surface oriented upward, for example. Further, a mirror 216 for reflecting a laser beam for laser length measurement emitted from a laser length measurement system 122 disposed outside the inspection chamber 103 is disposed on the stage 105. The multi-detector 222 is connected to a detection circuit 106 outside the electron beam column 102. The detection circuit 106 is connected to a chip pattern memory 123.

In the control system circuit 160, a control computer 110 for controlling the entire inspection apparatus 100 is connected to a position circuit 107, a comparison circuit 108, a reference image generation circuit 112, a stage control circuit 114, an aberration correction circuit 121, a lens control circuit 124, a blanking control circuit 126, a deflection control circuit 128, a storage device 109 such as a magnetic disk drive, a monitor 117, a memory 118, and a printer 119 via a bus 120. Further, the deflection control circuit 128 is connected to a digital-analog conversion (DAC) amplifiers 144, 146, and 148. The DAC amplifier 146 is connected to the main deflector 208 and the DAC amplifier 144 is connected to the sub-deflector 209. The DAC amplifier 148 is connected to the deflector 218.

Further, the chip pattern memory 123 is connected to the comparison circuit 108. Further, the stage 105 is driven by a drive mechanism 142 under the control of the stage control circuit 114. In the drive mechanism 142, for example, a drive system such as three-axis (X-Y-θ) motors driven in an X direction, a Y direction, and a θ direction in a stage coordinate system is configured and the stage 105 is movable in the X, Y, and θ directions. For these X-axis motor, Y-axis motor, and θ-axis motor not shown in the drawings, for example, step motors can be used. The stage 105 is movable in a horizontal direction and a rotational direction by the motors of the X, Y, and θ axes. In addition, a movement position of the stage 105 is measured by the laser length measurement system 122 and is supplied to the position circuit 107. The laser length measurement system 122 receives reflected light from the mirror 216 and measures a position of the stage 105 by the principle of a laser interference method. In the stage coordinate system, for example, an X direction, a Y direction, and a θ direction are set with respect to a plane orthogonal to an optical axis of multiple primary electron beams 20.

The electromagnetic lens 202, the electromagnetic lens 205, the electromagnetic lens 206, the electromagnetic lens 207 (objective lens), the electromagnetic lens 224, and the beam separator 214 are controlled by the lens control circuit 124. Further, the collective blanking deflector 212 is configured by two or more electrodes, and is controlled by the blanking control circuit 126 via a DAC amplifier not shown in the drawings for each electrode. As described later, the aberration corrector 220 is configured by three or more stages of electrode substrates and is controlled by the aberration correction circuit 121. The electrostatic lens array 221 is configured by three or more stages of electrode substrates and is controlled by the aberration correction circuit 121. The sub-deflector 209 is configured by four or more electrodes and is controlled by the deflection control circuit 128 via the DAC amplifier 144 for each electrode. The main deflector 208 is configured by four or more electrodes and is controlled by the deflection control circuit 128 via the DAC amplifier 146 for each electrode. The deflector 218 is configured by four or more electrodes and is controlled by the deflection control circuit 128 via the DAC amplifier 148 for each electrode.

A high-voltage power supply circuit not shown in the drawings is connected to the electron gun assembly 201, and an electron group emitted from a cathode is accelerated by application of an acceleration voltage from the high-voltage power supply circuit between a filament (cathode) and an extraction electrode (anode) not shown in the drawings in the electron gun assembly 201, application of a voltage of another extraction electrode (Wehnelt), and heating of the cathode at a predetermined temperature, becomes an electron beam 200, and is emitted.

Here, in FIG. 1, the configuration necessary for describing the first embodiment is described. The inspection apparatus 100 may generally include other necessary configuration.

Figure 2:
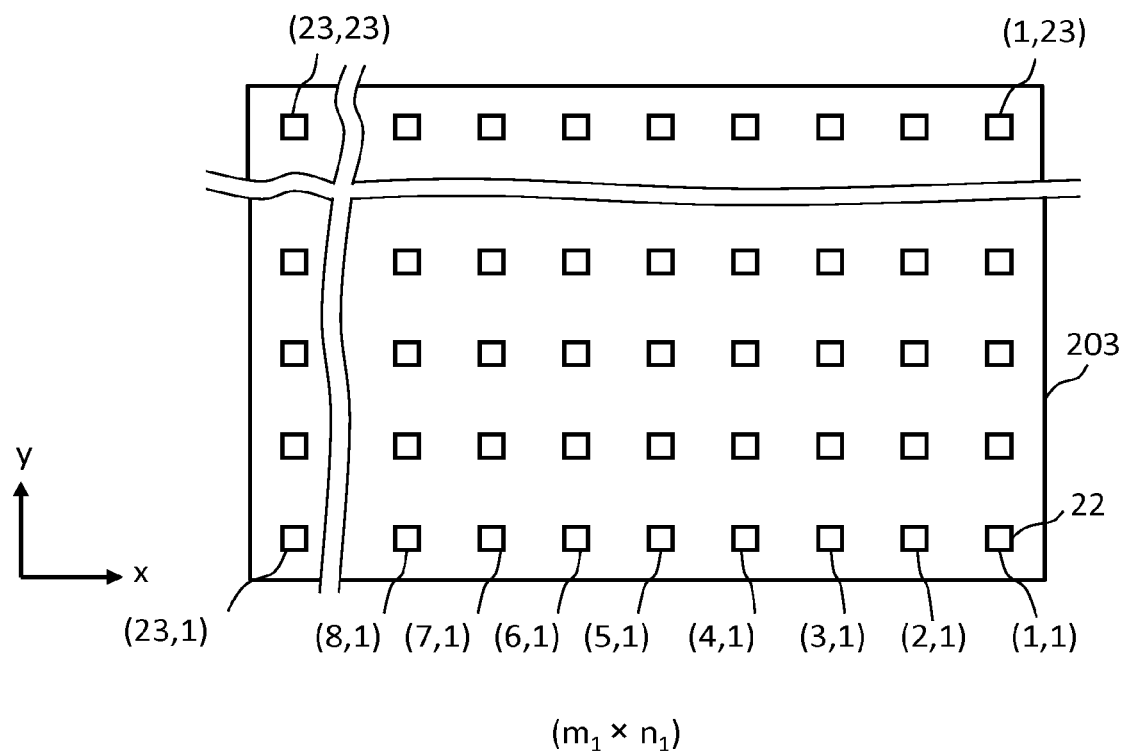
FIG. 2 is a conceptual diagram showing a configuration of a shaping aperture array substrate in the first embodiment.

FIG. 2 is a conceptual diagram showing a configuration of the shaping aperture array substrate in the first embodiment. In FIG. 2, in the shaping aperture array substrate 203, $m_1 \times n_1$ ($m_1$ and $n_1$ are integers of 2 or more) holes (openings) 22 to be arranged two-dimensionally in a width direction (x direction) and a length direction (y direction) are formed in the x and y directions at a predetermined arrangement pitch. In an example of FIG. 2, a case where 23×23 holes (openings) 22 are formed is shown. Each hole 22 is formed of a rectangle having the same dimension and shape. Alternatively, each hole 22 may have a shape of a circle with the same outer diameter. A part of the electron beam 200 passes through the plurality of holes 22, so that multiple beams 20 are formed. Here, an example in which two rows or more of holes 22 are disposed in both the width and length directions (x and y directions) is shown. However, the present invention is not limited thereto. For example, a plurality of rows of holes 22 may be disposed in one of the width and length directions (x and y directions) and only one row of holes 22 may be disposed in the other direction. Further, a method of disposing the holes 22 is not limited to the case where the holes 22 are disposed in a lattice in the width and length directions, as shown in FIG. 2. For example, the holes in a k-th row in the length direction (y direction) and the holes in a (k+1)-th row may be disposed to be deviated by a dimension a in the width direction (x direction). Likewise, the holes in the (k+1)-th column and a (k+2)-th column in the length direction (y direction) may be disposed to be deviated by a dimension b in the width direction (x direction).

Next, an operation of the image acquisition mechanism 150 in the inspection apparatus 100 will be described.

The electron beam 200 emitted from the electron gun assembly 201 (emission source) is refracted by the electromagnetic lens 202 and illuminates the entire shaping aperture array substrate 203. As shown in FIG. 2, the plurality of holes 22 (openings) are formed in the shaping aperture array substrate 203, and the electron beam 200 illuminates a region including all of the plurality of holes 22. Each part of the electron beam 200 with which the positions of the plurality of holes 22 are irradiated passes through the plurality of holes 22 of the shaping aperture array substrate 203, so that the multiple beams 20 (multiple primary electron beams) are formed.

The formed multiple beams 20 are refracted by the electromagnetic lens 205 and the electromagnetic lens 206, pass through the beam separator 214 disposed at a crossover position of each beam of the multiple beams 20 while repeating an intermediate image and a crossover, and travel to the electromagnetic lens 207 (objective lens). During this period, the aberration such as the astigmatism and/or the distortion aberration (distortion) is corrected by the aberration corrector 220. In addition, in a case where a focal position of the beam is shifted due to the correction by the aberration corrector 220, the shift of the focal position is individually corrected for each beam by the electrostatic lens array 221. In the example of FIG. 1, a case where the aberration corrector 220 is disposed in the magnetic field of the electromagnetic lens 205 is shown. By disposing the aberration corrector 220 in the magnetic field of the electromagnetic lens 205, a potential applied to a control electrode of the aberration corrector 220 can be decreased as compared as a case where the aberration corrector 220 is disposed outside the magnetic field. For example, the potential can be decreased to about $1/100$. However, the present invention is not limited thereto. The aberration corrector 220 may be disposed between the shaping aperture array substrate 203 and the beam separator 214.

When the multiple beams 20 are incident on the electromagnetic lens 207 (objective lens), the electromagnetic lens 207 focuses the multiple beams 20 on the substrate 101. In other words, at least one of the astigmatism and the distortion aberration of the electromagnetic lens 207 (an example of the electron optical system) is corrected by the aberration corrector 220, and the electromagnetic lens 207 guides the multiple beams 20 to the substrate 101. The multiple beams 20 focused on the surface of the substrate 101 (target object) by the objective lens 207 are collectively deflected by the main deflector 208 and the sub-deflector 209, and the respective irradiation positions of the respective beams on the substrate 101 are irradiated with the multiple beams 20. Note that, when the entire multiple beams 20 are collectively deflected by the collective blanking deflector 212, the positions of multiple beams 20 are shifted from the center hole of the limit aperture substrate 213 and the entire multiple beams 20 are shielded by the limit aperture substrate 213. On the other hand, the multiple beams 20 not deflected by the collective blanking deflector 212 pass through the center hole of the limit aperture substrate 213 as shown in FIG. 1. Blanking control is performed by turning on/off the collective blanking deflector 212 and turning on/off of the beams is collectively controlled. As described above, the limit aperture substrate 213 shields the multiple beams 20 deflected so that the beams are turned off by the collective blanking deflector 212. Further, the multiple beams 20 for inspection (image acquisition) are formed by a group of beams formed until the beams are turned off after the beams are turned on and having passed through the limit aperture substrate 213.

If a desired position of the substrate 101 is irradiated with the multiple beams 20, a secondary electron flux (multiple secondary electron beams 300) including reflected electrons, corresponding to the respective beams of the multiple beams 20 (multiple primary electron beams), is emitted from the substrate 101 due to the irradiation of the multiple beams 20.

The multiple secondary electron beams 300 emitted from the substrate 101 travel to the beam separator 214 through the electromagnetic lens 207.

Here, the beam separator 214 has a plurality of magnetic poles of two or more poles using a coil and a plurality of electrodes of two or more poles. In addition, a directional magnetic field is generated by the plurality of magnetic poles. Similarly, a directional electric field is generated by the plurality of electrodes. Specifically, the beam separator 214 generates an electric field and a magnetic field in directions orthogonal to each other on a plane orthogonal to a travel direction (orbit center axis) of a center beam of the multiple beams 20. The electric field exerts a force in the same direction regardless of a travel direction of electrons. Meanwhile, the magnetic field exerts a force according to the Fleming's left-hand rule. Therefore, it is possible to change the direction of the force acting on the electrons depending on a penetration direction of the electrons. The force due to the electric field and the force due to the magnetic field cancel each other in the multiple beams 20 penetrating the beam separator 214 from the upper side, and the multiple beams 20 go straight downward. Meanwhile, in the multiple secondary electron beams 300 penetrating the beam separator 214 from the lower side, both the force due to the electric field and the force due to the magnetic field act in the same direction, and the multiple secondary electron beams 300 are bent obliquely upward and separated from the multiple beams 20.

The multiple secondary electron beams 300 that are bent obliquely upward and separated from the multiple beams 20 are further bent by the deflector 218 and projected onto the multi-detector 222 while being refracted by the electromagnetic lens 224. The multi-detector 222 detects the projected multiple secondary electron beams 300. The multi-detector 222 has, for example, a diode type two-dimensional sensor not shown in the drawings. At a position of the diode type two-dimensional sensor corresponding to each beam of the multiple beams 20, each secondary electron of the multiple secondary electron beams 300 collides with the diode type two-dimensional sensor, generates electrons, and generates secondary electron image data for each pixel. An intensity signal detected by the multi-detector 222 is output to the detection circuit 106.

Figure 3:
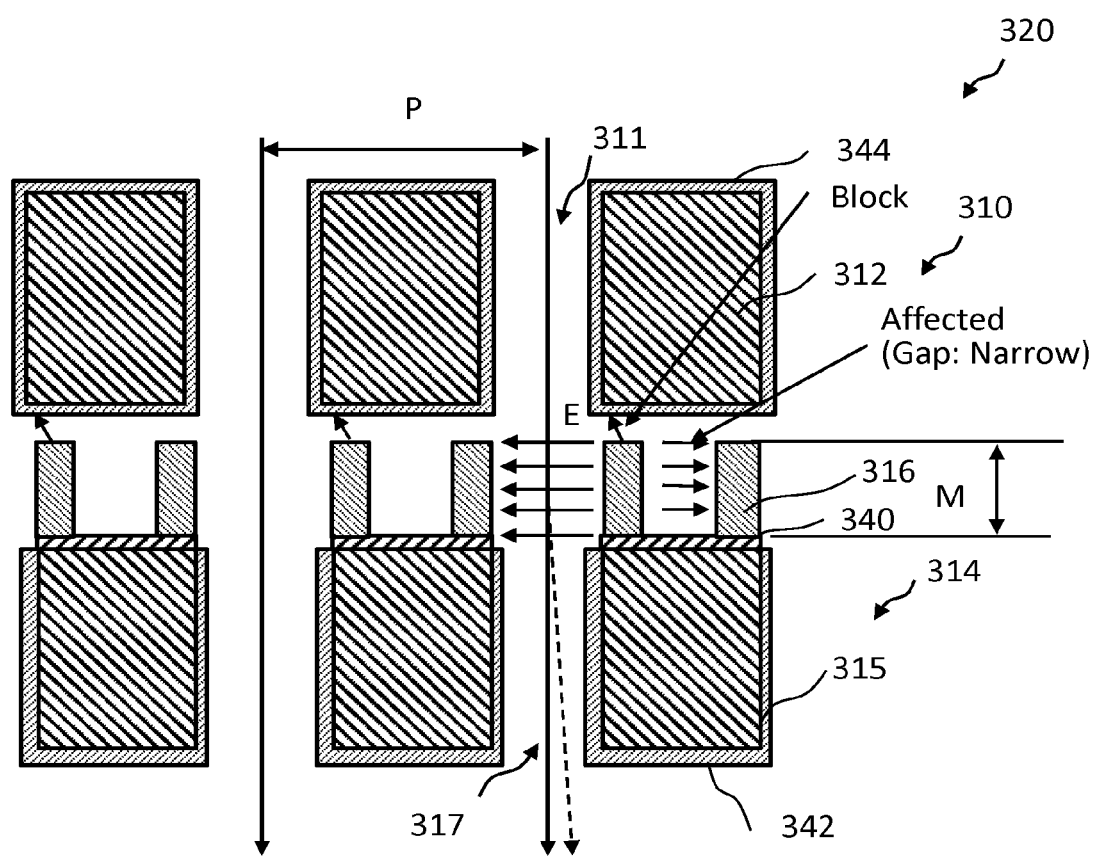
FIG. 3 is a diagram showing an example of a cross-sectional configuration of an aberration corrector according to a first comparative example of the first embodiment.

FIG. 3 is a diagram showing an example of a cross-sectional configuration of an aberration corrector according to a first comparative example of the first embodiment. In FIG. 3, an aberration corrector 320 according to the first comparative example of the first embodiment includes a first electrode substrate 310 and a second electrode substrate 314. In the first electrode substrate 310, a plurality of passage holes 311 through which multiple beams pass are formed in a substrate body 312, and an entire exposure surface of the substrate body 312 is covered with a shield film 344. In the second electrode substrate 314, a plurality of passage holes 311 having the same hole diameter size as that of the first electrode substrate 310 through which the multiple beams pass are formed in a substrate body 315. In addition, a plurality of electrodes 316 to be multipoles are disposed on a substrate body 315 with an insulating layer 340 interposed therebetween so as to surround the passage hole 311. In addition, a shield film 342 is formed on a passage hole inner wall, a bottom surface, and a side surface of the substrate body 315. In order to correct the aberration such as the astigmatism or the distortion (distortion aberration), it is necessary to individually correct an orbit of each beam of the multiple beams. Therefore, the plurality of electrodes 316 to be the multipoles are disposed in the second electrode substrate 314 so as to surround the passage hole 311. Since an electric field E formed between the electrodes 316 facing each other with the passage hole 311 interposed therebetween does not spread upward by the first electrode substrate 310, the electric field E acts in parallel between the facing electrodes 316. Therefore, the electric field E formed between the facing electrodes 316 is determined by the thickness M of the electrode 316. Therefore, in order to apply a deflection amount for correcting the aberration to each electron beam, the thickness M of each electrode 316 of the multipole lens needs to be about several 10 μm, for example, 50 μm. As the inter-beam pitch P becomes narrow, a gap between the electrodes for adjacent beams becomes narrow as shown in FIG. 3. When the gap between the electrodes for the adjacent beams is narrowed, electrons also move between the electrodes for the adjacent beams. In such a case, a movement amount of electrons between the electrodes for the adjacent beams increases according to the thickness of the electrode 316. As a result, each electric field may be affected by the potential for the adjacent beams. Therefore, it is technically difficult to exhibit sufficient performance as an aberration corrector with electrodes having a thickness of several 10 μm when the inter-beam pitch P is narrow. For this reason, it is desirable to make the electrode as thin as possible. Therefore, in the first embodiment, the thickness of the electrode is reduced by using an upper space of the electrode.

Figure 4A:
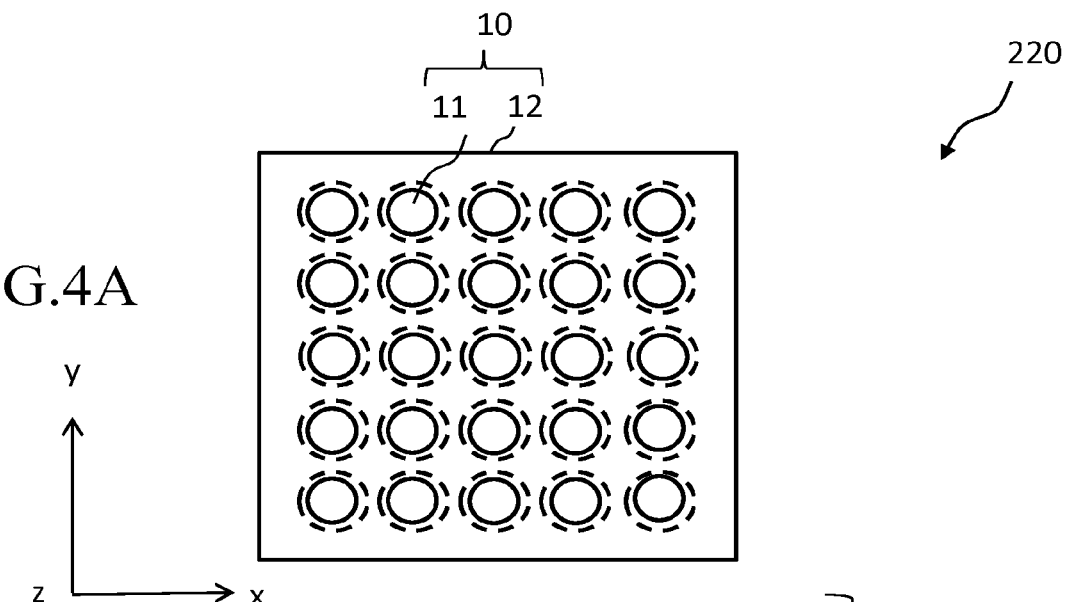
FIGS. 4A to 4C are top views showing an example of a configuration of each electrode substrate of an aberration corrector in the first embodiment.
Figure 4B:
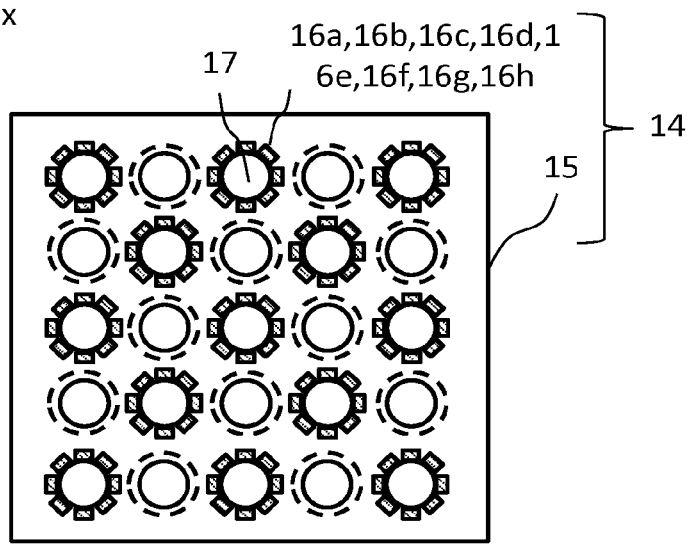
Figure 4C:
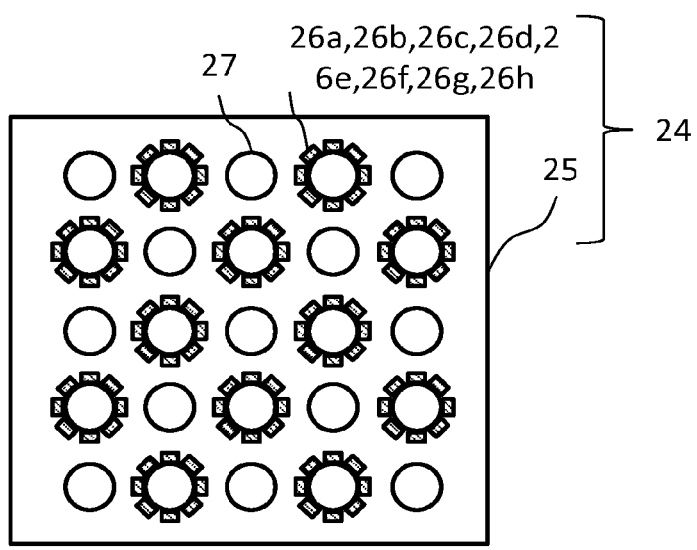

FIGS. 4A to 4C are top views showing an example of a configuration of each electrode substrate of the aberration corrector in the first embodiment.

Figure 5:
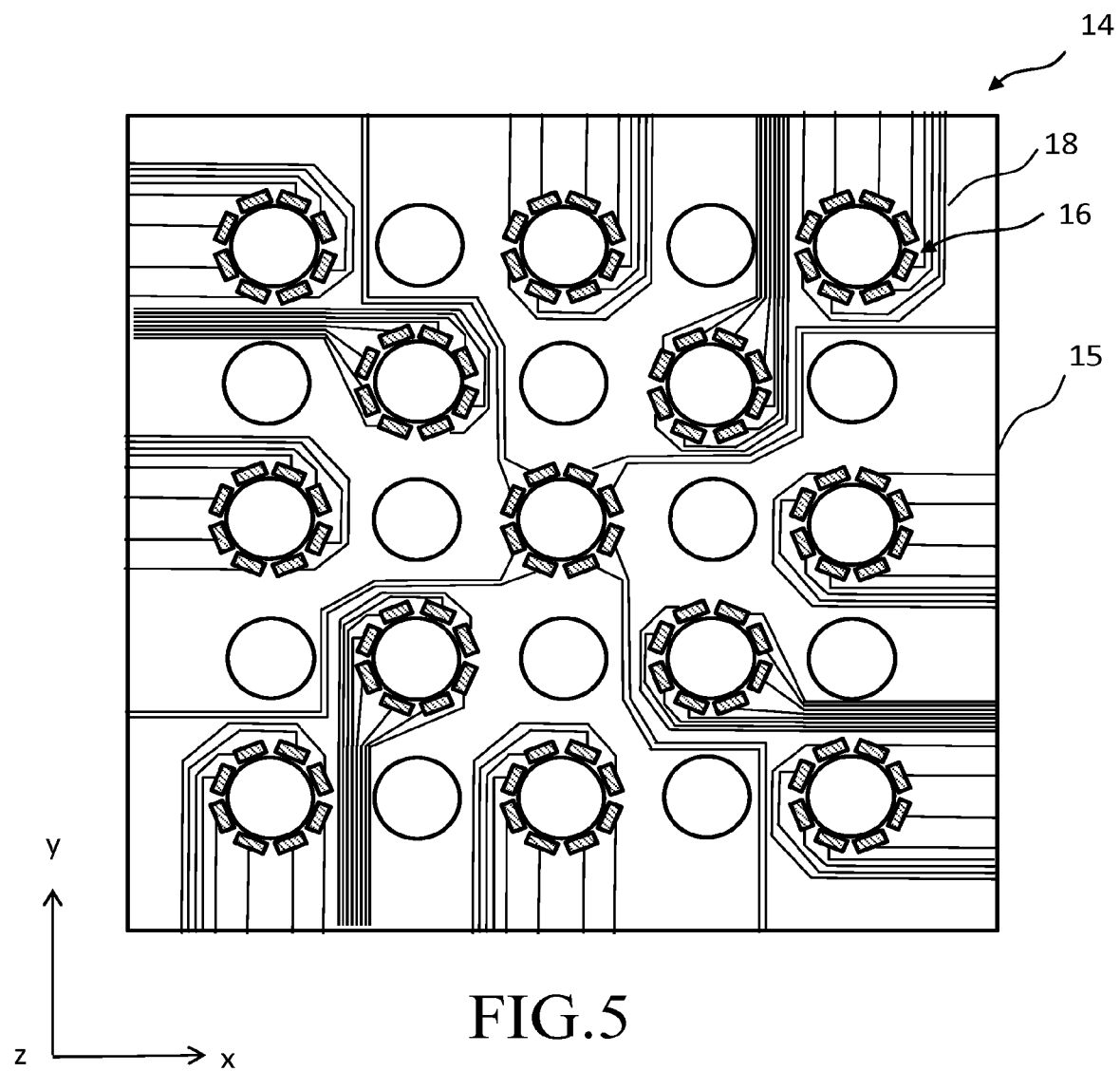
FIG. 5 is a top view showing an example of wirings of multipoles disposed on a substrate of a second stage of the aberration corrector in the first embodiment.

FIG. 5 is a top view showing an example of wirings of multipoles disposed on a substrate of a second stage of the aberration corrector in the first embodiment.

Figure 6:
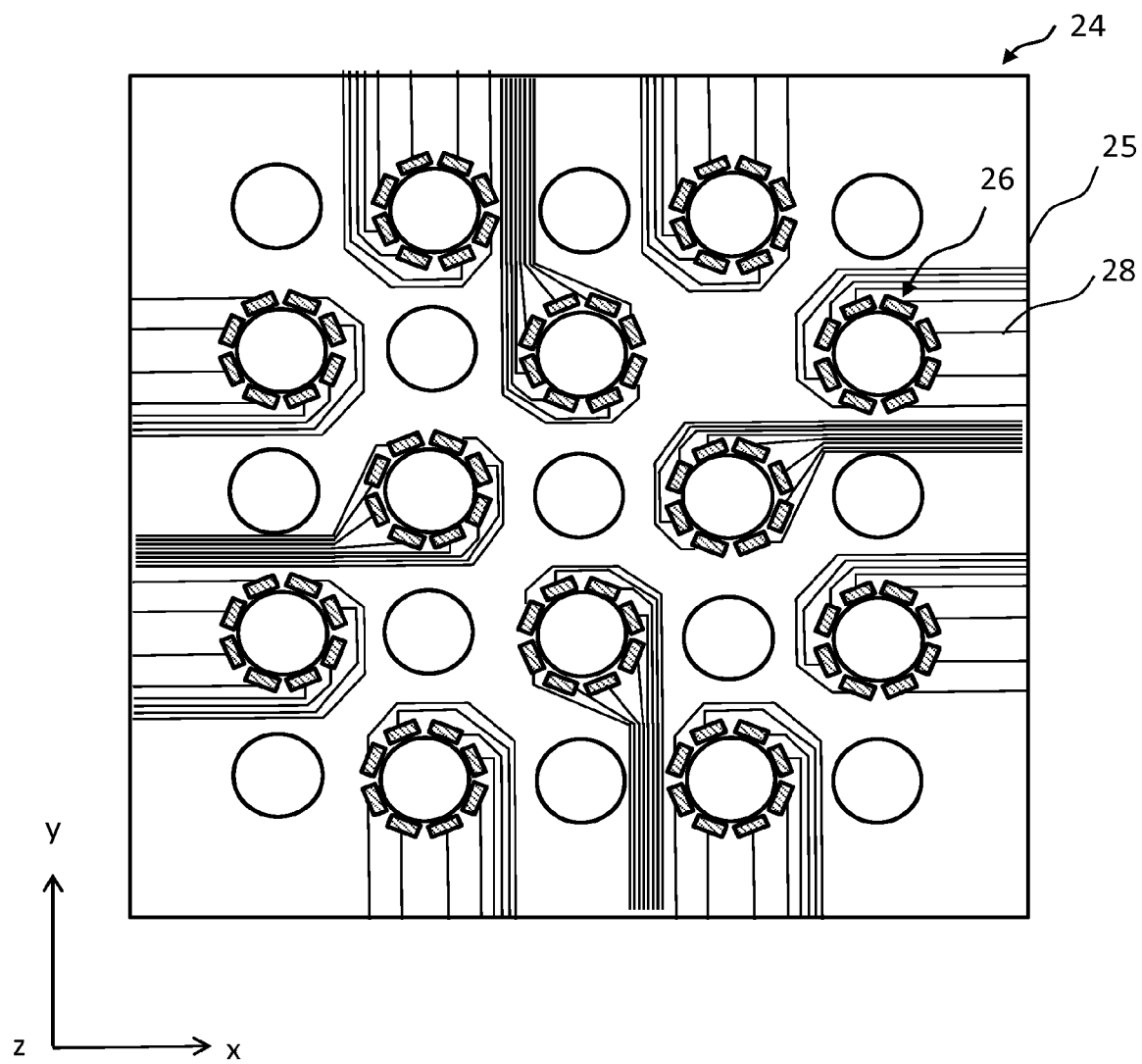
FIG. 6 is a top view showing an example of wirings of multipoles disposed on a substrate of a third stage of the aberration corrector in the first embodiment.

FIG. 6 is a top view showing an example of wirings of multipoles disposed on a substrate of a third stage of the aberration corrector in the first embodiment.

Figure 7:
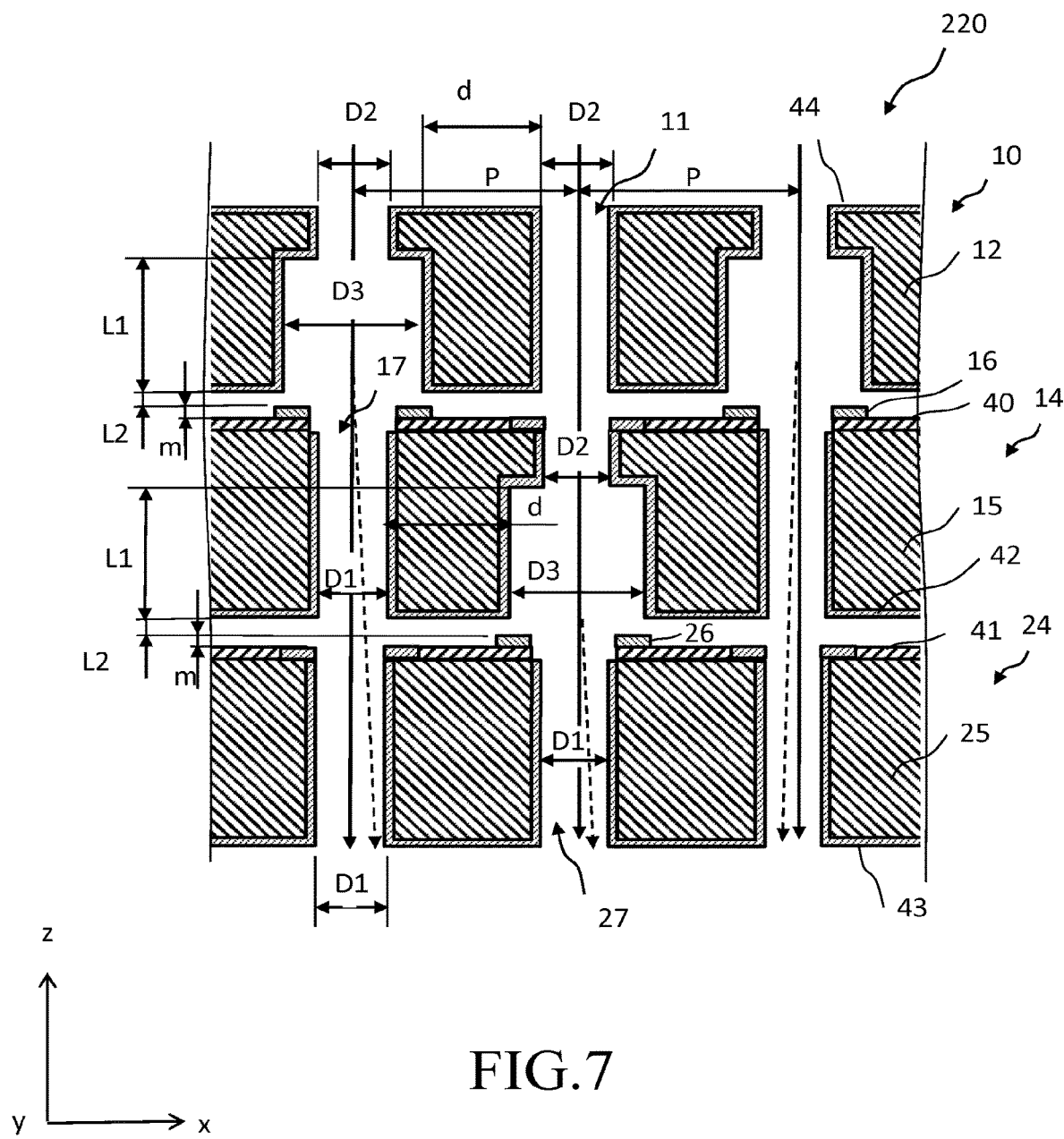
FIG. 7 is a cross-sectional view showing an example of a configuration of the aberration corrector in the first embodiment.

FIG. 7 is a cross-sectional view showing an example of a configuration of the aberration corrector in the first embodiment.

The aberration corrector 220 includes three or more stages of electrode substrates disposed with a predetermined gap. In the examples of FIGS. 4A to 4C and 7, the aberration corrector 220 configured by a first electrode substrate 10 (an example of the first electrode substrate), a second electrode substrate 14 (an example of the second electrode substrate), and a third electrode substrate 24 (an example of the third electrode substrate) sequentially disposed from an upper stage, which are electrode substrates of three stages disposed with a gap L2 between the electrode substrates, is shown. In other words, the first electrode substrate 10 is disposed above the second electrode substrate 14 with the gap L2. Similarly, the second electrode substrate 14 is disposed above the third electrode substrate 24 with the gap L2. In the examples of FIGS. 4A to 4C, 5, and 6, a case of using 5×5 multiple beams 20 is shown. FIG. 7 shows a portion including a region through which some beams of the 5×5 multiple beams 20 pass.

In the first electrode substrate 10, a plurality of passage holes 11 (first passage holes) through which the multiple beams 20 pass are formed in the substrate body 12. As shown in FIGS. 4A and 7, in the first electrode substrate 10, the plurality of passage holes 11 are formed at positions through which the multiple beams 20 with the inter-beam pitch P pass. Among the plurality of passage holes 11 of the first electrode substrate 10, some passage holes 11 through which some beam arrays set in advance pass are formed to have a hole diameter D2 (second hole diameter) from a top surface (upstream side in a beam travel direction) of the substrate body 12 to the middle toward a back surface, and increase in size to a hole diameter D3 (third hole diameter) from the middle to the back surface. Further, as shown in FIG. 7, a top surface, a side surface, a bottom surface, and inner walls of the plurality of passage holes 11 of the substrate body 12 are covered with a shield electrode 44. The shield electrode 44 is disposed on at least the inner walls of the plurality of passage holes 11. The remaining passage holes 11 among the plurality of passage holes 11 are formed to have a hole diameter D2 from the top surface to the back surface of the substrate body 12. However, the present invention is not limited thereto. Similarly to some passage holes 11, the remaining passage holes 11 may be formed so as to increase in size from the middle.

The second electrode substrate 14 is disposed below (the downstream side in the beam travel direction) the first electrode substrate 10. In the second electrode substrate 14, a plurality of passage holes 17 (second passage holes) through which the multiple beams 20 with the inter-beam pitch P pass are formed in a substrate body 15. As shown in FIGS. 4B and 7, among the plurality of passage holes 17 of the second electrode substrate 14, some passage holes 17 through which some beam arrays set in advance as described above pass are formed to have a hole diameter D1 (first hole diameter) from a top surface to a back surface of the substrate body 15. A plurality of electrodes 16 (a to h) (an example of first electrodes) to be multipoles of four or more poles are disposed individually on each top surface region of the top surface regions around some passage holes 17. In the examples of FIGS. 4B and 7, a case where the eight-pole electrodes 16 (a to h) are disposed is shown. For example, in a case of correcting the distortion aberration of the multiple beams 20, the four-pole electrodes 16 disposed to face each other by two poles in orthogonal directions (x and y directions) may be used for each beam. For example, in a case of correcting the astigmatism of the multiple beams 20, it is preferable that the 8-pole electrodes 16 disposed so as to face each other by two poles in 45° and 135° directions that are intermediate phases in addition to the orthogonal directions (x and y direction) are disposed for each beam. Note that, when the direction of the astigmatism is known, the 4-pole electrodes 16 disposed so as to face each other by two poles in the orthogonal directions (x and y directions) may be used. In the second electrode substrate 14, an insulating layer 40 is disposed between the substrate body 15 and the plurality of electrodes 16 (a to h) for each beam. The remaining passage holes 17 are formed to have a hole diameter D2 (second hole diameter) from a top surface of the substrate body 15 to the middle toward a back surface, and increase in size to a hole diameter D3 (third hole diameter) from the middle to the back surface of the second electrode substrate 14. Further, as shown in FIG. 7, a side surface, a bottom surface, and inner walls of the plurality of passage holes 17 of the substrate body 15 are covered with a shield electrode 42.

The third electrode substrate 24 is disposed below (the downstream side in the beam travel direction) the second electrode substrate 14. In the third electrode substrate 24, a plurality of passage holes 27 (third passage holes) through which the multiple beams 20 with the inter-beam pitch P pass are formed in a substrate body 25. As shown in FIGS. 4C and 7, a plurality of electrodes 26 (a to h) (an example of second electrodes) to be multipoles of four or more poles are disposed individually on each top surface region of the top surface regions around some passage holes 27 corresponding to the remaining passage holes 17 in which the plurality of electrodes 16 are not disposed, among the plurality of passage holes 27. In the examples of FIGS. 4C and 7, a case where the 8-pole electrodes 26 (a to h) are disposed is shown. Similarly to the plurality of electrodes 16, for the plurality of electrodes 26, for example, in a case of correcting the distortion aberration of the multiple beams 20, the four-pole electrodes 16 disposed so as to face each other by two poles in the orthogonal directions (x and y directions) may be used for each beam. For example, in a case of correcting the astigmatism of the multiple beams 20, it is preferable that the 8-pole electrodes 16 disposed so as to face each other by two poles in 45° and 135° directions that are intermediate phases in addition to the orthogonal directions (x and y direction) are disposed for each beam. Note that, when the direction of the astigmatism is known, the 4-pole electrodes 26 disposed so as to face each other by two poles in the orthogonal directions (x and y directions) may be used. Further, in the third electrode substrate 24, an insulating layer 41 is disposed between a substrate body 25 and a plurality of electrodes 26 (a to h) for each beam. Further, as shown in FIG. 6, a wiring 28 for each electrode 26 (V1 to V8) extends to an outer peripheral portion of the substrate body 25 on the insulating layer 41, and is electrically connected to the aberration correction circuit 121 with a connector, a cable, and the like interposed therebetween. Among the plurality of passage holes 27 of the third electrode substrate 24, some passage holes 27 in which the plurality of electrodes 26 are disposed are formed to have a hole diameter D1 (first hole diameter) from a top surface to a back surface of the substrate body 25. In the example of FIG. 7, a case where the remaining passage holes 27 in which the plurality of electrodes 26 are not disposed are also formed to have a hole diameter D1 (first hole diameter) from the top surface to the back surface of the substrate body 25 is shown. Further, as shown in FIG. 7, a side surface, a bottom surface, and inner walls of the plurality of passage holes 27 of the substrate body 25 are covered with a shield electrode 43.

In other words, among the plurality of passage holes 11 of the first electrode substrate 10, the remaining passage holes 11 located above some passage holes 17 in which the plurality of electrodes 16 are disposed are formed to have a hole diameter D2 from a top surface of the first electrode substrate 10 to the middle toward a back surface of the first electrode substrate 10, and to have the hole diameter D3 larger than the hole diameter D1 and the hole diameter D2 from the middle to the back surface of the first electrode substrate 10. Similarly, among the plurality of passage holes 17 of the second electrode substrate 14, the remaining passage holes 17 located above some passage holes 17 in which the plurality of electrodes 26 are disposed are formed to have the hole diameter D2 from the top surface of the second electrode substrate 14 to the middle toward the back surface of the second electrode substrate 14, and to have the hole diameter D3 larger than the hole diameter D1 and the hole diameter D2 from the middle to the back surface of the second electrode substrate 14. Note that, the hole diameter D1 and the hole diameter D2 may have the same size or different sizes. In the example of FIG. 7, a case where the hole diameter D1 and the hole diameter D2 have the same size is shown.

As some passage holes 17 through which some beam arrays set in advance pass, in the examples of FIGS. 5 and 7, the plurality of electrodes 16 are disposed on the 13 passage holes 17 of the second electrode substrate 14 through which 13 beam arrays disposed every other in the x and y directions among the 5×5 multiple beams 20 pass. In the examples of FIGS. 6 and 7, the plurality of electrodes 26 are disposed on the 12 passage holes 27 of the third electrode substrate 24 through which the remaining 12 beam arrays among the 5×5 multiple beams 20 pass.

Further, a plurality of wirings 18 (first wirings) connected to the plurality of electrodes 16 are disposed without intersecting on the same second electrode substrate 14 as the second electrode substrate 14 on which the plurality of electrodes 16 are disposed, as shown in FIG. 5. As shown in FIG. 5, the wiring 18 for each electrode 16 (V1 to V8) extends to the outer peripheral portion of the substrate body 15 on the insulating layer 40, and is electrically connected to the aberration correction circuit 121 with a connector, a cable, and the like (not shown in the drawings) interposed therebetween. Since the number of electrodes disposed on the second electrode substrate 14 can be suppressed to about 50% of the number of electrodes required for the entire multiple beams 20, the number of wirings can also be suppressed to 50%, and the plurality of wirings 18 can be disposed in one layer without being multilayered.

Similarly, the plurality of wirings 28 (second wirings) connected to the plurality of electrodes 26 are disposed without intersecting on the same third electrode substrate 24 as the third electrode substrate 24 on which the plurality of electrodes 26 are disposed, as shown in FIG. 6. As shown in FIG. 6, the wiring 28 for each electrode 26 (V1 to V8) extends to the outer peripheral portion of the substrate body 25 on the insulating layer 41, and is electrically connected to the aberration correction circuit 121 with a connector, a cable, and the like (not shown in the drawings) interposed therebetween. Since the number of electrodes disposed on the third electrode substrate 24 can be suppressed to about 50% of the number of electrodes required for the entire multiple beams 20, the plurality of wirings 28 can be disposed in one layer without being multilayered.

For example, silicon (Si) is preferably used as a material of the substrate body 12 of the first electrode substrate 10, a material of the substrate body 15 of the second electrode substrate 14, and a material of the substrate body 25 of the third electrode substrate 24. The substrate bodies 12, 15, and 25 are preferably Si substrates having a film thickness of about several 100 µm, for example. For example, a Si substrate having a film thickness of about 200 to 500 µm is preferable. In addition, as a material of the plurality of electrodes 16 (a to h) for each beam of the second electrode substrate 14 and the plurality of electrodes 26 (a to h) for each beam of the third electrode substrate 24, for example, a metal which is hardly oxidized, such as aluminum (Al), platinum (Pt), titanium (Ti), or palladium (Pd), is preferably used. Each of the electrodes 16 and 26 (a to h) is formed to have a film thickness of, for example, several µm. For example, the electrodes 16 and 26 (a to h) are formed to have a film thickness of 1 to 10 µm. In addition, the shield electrode 44 formed on the top surface, the side surface, and the bottom surface of the substrate body 12 and the inner walls of the plurality of passage holes 11, the shield electrode 42 formed on the side surface and the bottom surface of the substrate body 15 and the inner walls of the plurality of passage holes 17, and the shield electrode 43 formed on the side surface and the bottom surface of the substrate body 25 and the inner walls of the plurality of passage holes 27 are all formed to have a film thickness of several µm. For example, the substrate bodies are covered with the shield electrodes 42, 43, and 44 having a film thickness of 1 to 10 µm. As the material of the shield electrodes 42, 43, and 44, similarly to the electrodes 16 and 26, for example, a metal which is hardly oxidized, such as Al, Pt, Ti, or Pd, is preferably used. In other words, the top surface, the side surface, the bottom surface, and the inner walls of the plurality of passage holes 11 of the substrate body 12 made of the Si material are coated with, for example, an Al film to be the shield electrode 44. Similarly, the side surface, the bottom surface, and the inner walls of the plurality of passage holes 17 of the substrate body 15 made of the Si material are coated with, for example, an Al film to be the shield electrode 42. Similarly, the side surface, the bottom surface, and the inner walls of the plurality of passage holes 27 of the substrate body 25 made of the Si material are coated with, for example, an Al film to be the shield electrode 43.

Here, as shown in FIG. 7, an upper portion of each of the passage holes 11 of the first electrode substrate 10 located on the plurality of electrodes 16 of the second electrode substrate 14 is formed to have the hole diameter D2, and a lower portion of each of the passage holes 11 of the first electrode substrate 10 is formed to have the hole diameter D3 larger than the hole diameter D2. Therefore, a flange portion extending toward the inside of the passage hole 11 is formed in the upper portion of each of the passage holes 11 of the first electrode substrate 10 located on the plurality of electrodes 16 of the second electrode substrate 14. Similarly, an upper portion of each of the passage holes 17 of the second electrode substrate 14 located on the plurality of electrodes 26 of the third electrode substrate 24 is formed to have the hole diameter D2, and a lower portion of each of the passage holes 17 of the second electrode substrate 14 is formed to have the hole diameter D3 larger than the hole diameter D2. Therefore, a flange portion extending toward the inside of the passage hole 17 is formed in the upper portion of each of the passage holes 17 of the second electrode substrate 14 located on the plurality of electrodes 26 of the third electrode substrate 24. As the hole diameter D3, D3 to be a total size in the x direction of the two facing electrodes 16 is preferably formed to be larger than D1 and D2 such that portions on the two facing electrodes 16 surrounding the passage hole 17 are opened as the passage hole 11. For example, when D1 and D2 are formed to be about several 100 μm, D3 is preferably formed to be larger than D1 and D2 by about several 10 μm (for example, 10 to 50 μm).

Figure 8:
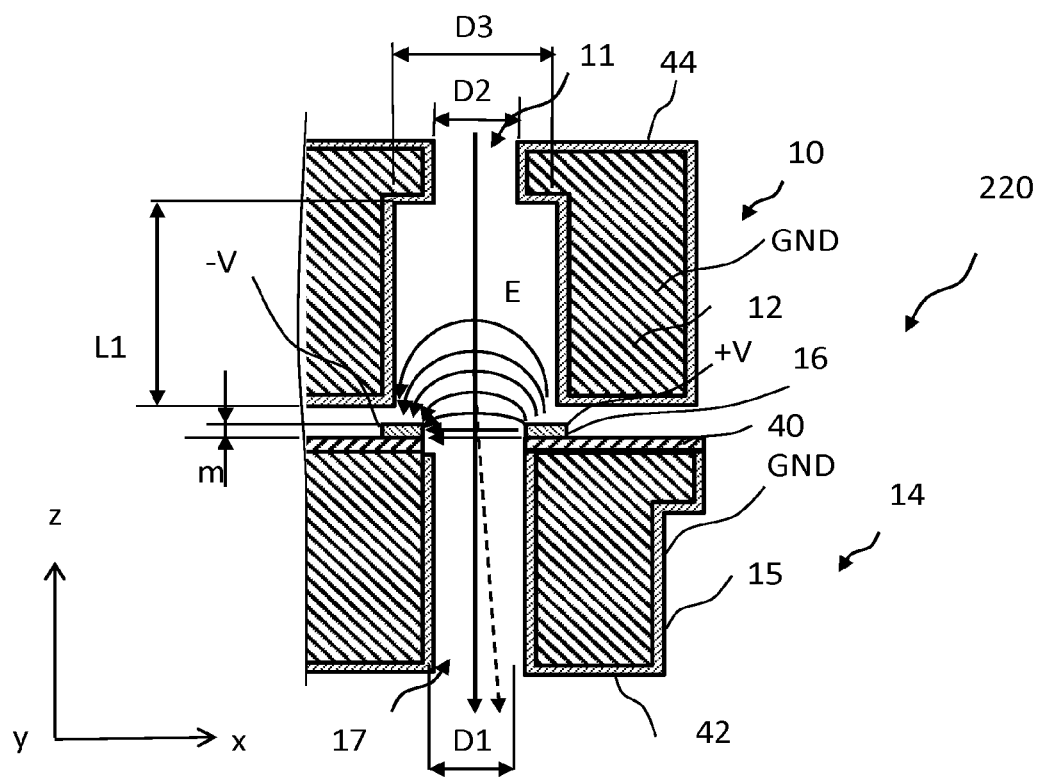
FIG. 8 is a diagram showing an example of an electric field generated between electrodes for one beam of the aberration corrector in the first embodiment.

FIG. 8 is a diagram showing an example of an electric field generated between electrodes for one beam of the aberration corrector in the first embodiment. FIG. 8 show, as an example, a relation between the plurality of electrodes 16 disposed on the second electrode substrate 14 and the passage hole 11 of the first electrode substrate 10 above the electrodes. The same is applied to a relation between the plurality of electrodes 26 disposed on the third electrode substrate 24 and the passage hole 17 of the second electrode substrate 14 above the electrodes. A potential of +V is applied to one of two facing electrodes among the plurality of electrodes 16 for one beam. A potential of −V having the same potential with a reversed sign is applied to the other. In addition, a ground (GND) potential is applied to the shield electrodes 42 and 44. In other words, the potential of +V larger than the GND potential is applied to one of the two facing electrodes. The potential of −V smaller than the GND potential is applied to the other. Therefore, an electric field E traveling from one electrode 16 to which the potential of +V has been applied to the other electrode 16 to which the potential of −V has been applied is formed. In a case where the GND potential is set to 0 V, for example, a potential of +5 V to +15 V is applied as +V. As −V, for example, a potential of −15 V to −5 V is applied.

Here, in the first comparative example shown in FIG. 3 described above, since the portion on the electrode 316 is blocked by the upper electrode 310, the electric field is absorbed (or blocked) by the upper electrode 310. Therefore, the electric field E can be generated only in the space between the two facing electrodes 316. For this reason, the electric field cannot be applied unless the entering electron beam reaches between the two facing electrodes 316. As a result, a deflection fulcrum is near a center position in the height direction (thickness direction) of the electrode 316. Therefore, the electrode 316 having a large thickness is required. On the other hand, in the aberration corrector 220 of the first embodiment, as shown in FIG. 8, the passage hole 11 of the first electrode substrate 10 is formed to be wider than the passage hole 17 in which the electrode 16 of the second electrode substrate 14 is disposed. For this reason, the portion on the electrode 16 is opened by the passage hole 11. Therefore, the electric field E can also be spread to the space in the passage hole 11 on the two facing electrodes 16. In addition, since the upper portion of the passage hole 11 of the first electrode substrate 10 shown in FIG. 8 is narrowed from the hole diameter D3 to the hole diameter D2 by the flange portion, a direction of a line of electric force can be easily bent. For this reason, the electric field does not diverge upward from the electrode substrate 10 of the upper stage, and the electric field E can be formed in the passage hole 11 on the two facing electrodes 16. Therefore, the electric field can be applied to the electron beam entering the passage hole 11 of the first electrode substrate 10 while the electron beam passes through the passage hole 11. As a result, the deflection fulcrum can be provided in the middle of the passage hole 11 on the electrode 16. Accordingly, the thickness of the electrode 16 can be reduced.

In addition, as shown in FIG. 7, the aberration corrector 220 is formed such that a value (d/L2) obtained by dividing a distance d between the portion formed to have the hole diameter D3 of the passage hole 11 of the first electrode substrate 10 and the adjacent passage hole 11 by a gap L2 between the first electrode substrate 10 and the second electrode substrate 14 becomes equal to or larger than a threshold Th. Similarly, the aberration corrector 220 is formed such that a value (d/L2) obtained by dividing the distance d between the portion formed to have the hole diameter D3 of the passage hole 17 of the second electrode substrate 14 and the adjacent passage hole 17 by the gap L2 between the second electrode substrate 14 and the third electrode substrate 24 becomes equal to or larger than the threshold Th.

Figure 9A:
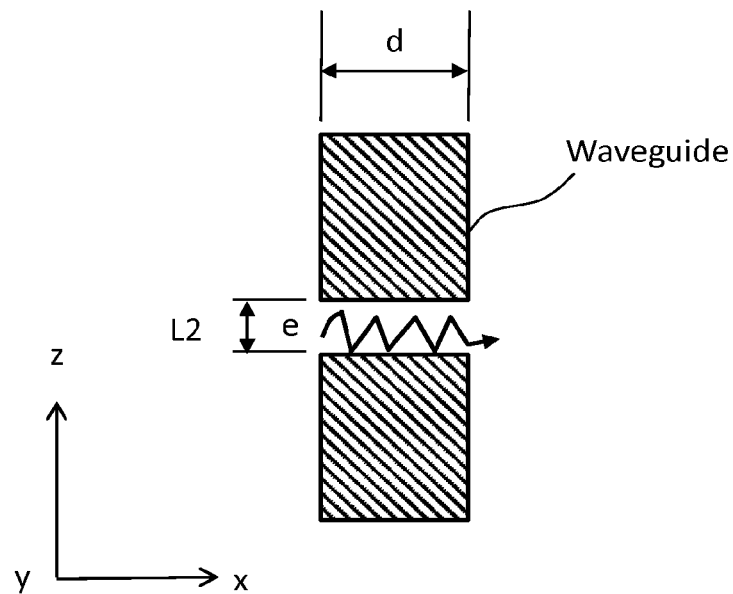
FIGS. 9A and 9B are diagrams illustrating attenuation of an electric field in the first embodiment.
Figure 9B:
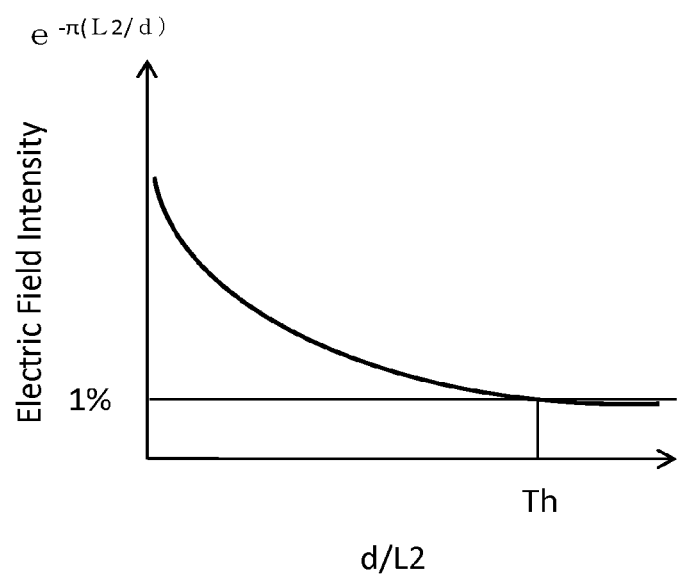

FIGS. 9A and 9B are diagrams illustrating attenuation of the electric field in the first embodiment. FIG. 9A shows a model illustrating the attenuation of the electric field. FIG. 9A shows a case where electrons move in a waveguide having a hole diameter L2 and a length d as the model. In FIG. 9B, a vertical axis represents a ratio of electrons passing through the waveguide, and a horizontal axis represents an aspect ratio obtained by dividing the length d of the waveguide by the hole diameter L2. It can be seen that as the aspect ratio obtained by dividing the length d of the waveguide by the hole diameter L2 increases, the ratio of electrons passing through the waveguide decreases, in other words, the electrons hardly pass, and the generated electric field attenuates. When the model is applied to the aberration corrector 220 in the first embodiment, as the value (d/L2) obtained by dividing the distance d between the portion of the first electrode substrate 10 where the plurality of passage holes 11 are formed to have the hole diameter D3 and the adjacent passage hole 11 by the gap L2 between the first electrode substrate 10 and the second electrode substrate 14 increases, electrons are less likely to move to the side of the passage hole for the adjacent beam. Therefore, by setting d/L2 Th, the electric field formed by the multipolar electrodes 16 for each beam can be prevented from being affected by the potential for the adjacent beam. Similarly, as the value (d/L2) obtained by dividing the distance d between the portion of the second electrode substrate 14 where the plurality of passage holes 17 are formed to have the hole diameter D3 and the adjacent passage hole 17 by the gap L2 between the second electrode substrate 14 and the third electrode substrate 24 increases, electrons are less likely to move to the side of the passage hole for the adjacent beam. Therefore, by setting d/L2 Th, the electric field formed by the multipolar electrodes 26 for each beam can be prevented from being affected by the potential for the adjacent beam. For example, it is preferable to set the threshold Th to a value at which an attenuation graph defined by an exponential function converges or the number of passing electrons close to convergence becomes 1% or less. For example, the threshold Th is preferably about 2 to 10. Furthermore, 3 to 7 is more preferable.

In the aberration corrector 220 in the first embodiment, since the thickness of the electrodes 16 and 26 can be reduced to several μm, the gap L2 is defined by a gap between the bottom surface of the first electrode substrate 10 and the top surface of the electrode 16 of the second electrode substrate 14 (and a gap between the bottom surface of the second electrode substrate 14 and the top surface of the electrode 26 of the third electrode substrate 24), in the example of FIG. 7. Since the thickness of the electrode 16 is also included in the space between the electrodes 16 (26) of the actual adjacent beams, it is still preferable to set the threshold Th in consideration of the thickness of the electrode 16.

Further, in the first embodiment, as shown in FIG. 8, since the electric field E is formed on the two facing electrodes 16 (26), electrons need to be able to move on the electrodes 16 (26). Therefore, in the thickness of the first electrode substrate 10, the thickness L1 of the portion where the passage hole 11 is formed to have the hole diameter D3 is set to be larger than at least the gap L2 between the first electrode substrate 10 and the second electrode substrate 14. In other words, the first electrode substrate 10 and the second electrode substrate 14 are disposed such that L1>L2 is satisfied. Similarly, the second electrode substrate 14 and the third electrode substrate 24 are disposed such that L1>L2 is satisfied. Preferably, the electric field attenuates in the portion of the hole diameter D3 of the passage hole 11 (passage hole 17) and does not spread to the portion of the hole diameter D2. Therefore, the thickness L1 preferably satisfies L1>D3.

As described above, in the aberration corrector 220 of the first embodiment, relations of D3>D2, L1>L2, and d/L2 Th are satisfied. Further, L1>D3 is preferably satisfied.

Figure 10:
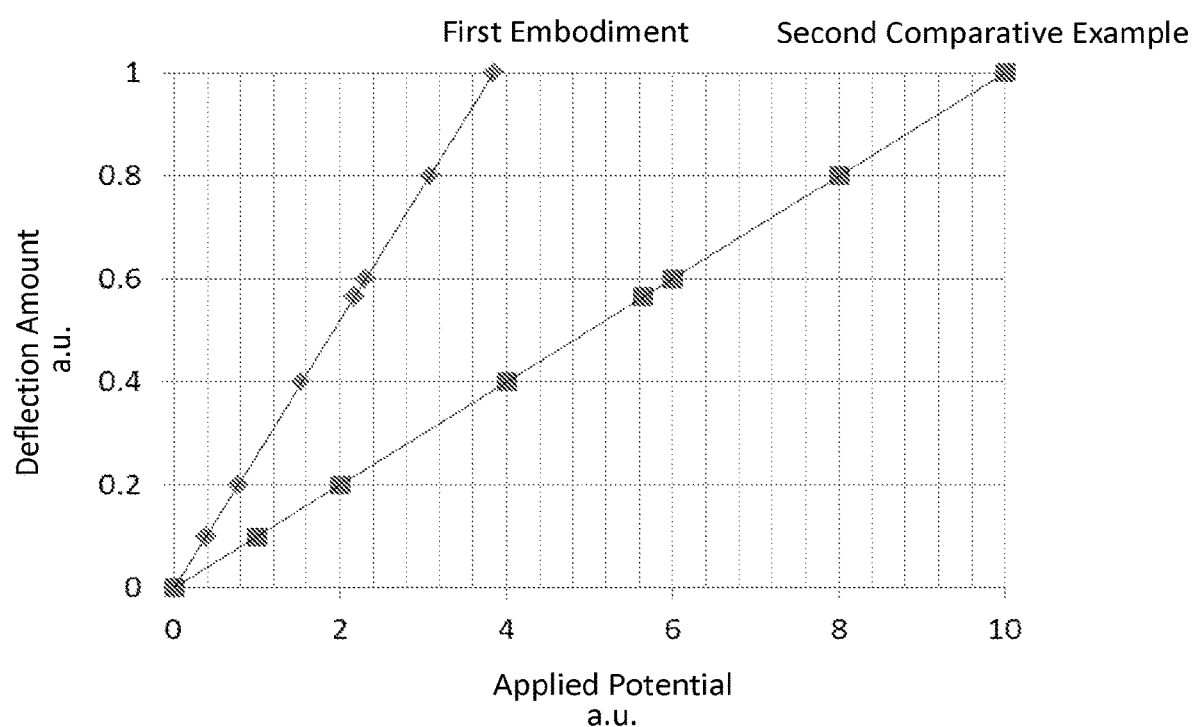
FIG. 10 is a diagram showing an example of a relation between a deflection amount and an applied potential in the first embodiment and a second comparative example.

FIG. 10 is a diagram showing an example of a relation between a deflection amount and an applied potential in the first embodiment and a second comparative example. In FIG. 10, a vertical axis represents a beam deflection amount, and a horizontal axis represents the potential applied to one of two electrodes facing each other. In the second comparative example shown in FIG. 10, a case of using an aberration corrector which is formed to have the same thickness as the electrode 16 (26) of the first embodiment and in which a portion on the electrode 16 (26) is blocked by the upper electrode substrate is shown. In other words, in the second comparative example, a case where D3=D2 is satisfied is shown. As shown in FIG. 10, it can be seen that the deflection amount when the same potential is applied can be increased in the first embodiment in which the electric field E is spread to the space on the electrodes 16 (26), as compared with the second comparative example in which the electric field is formed only in the space between the electrodes 16 (26). Conversely, by spreading the electric field E in the space on the electrode 16 (26), the thickness of the electrode 16 (26) can be reduced.

FIGS. 11A and 11B are diagrams showing an example of a distortion aberration (distortion) in the first embodiment. In the examples of FIGS. 11A and 11B, a case where 5×5 multiple beams 20 are used is shown. If the plurality of holes 22 of the shaping aperture array substrate 203 are formed in a matrix at a predetermined pitch in the x and y directions, ideally, as shown in FIG. 11B, irradiation positions 19 of the multiple beams 20 with which the substrate 101 is irradiated should also be arranged in a matrix at a predetermined reduction ratio. However, when an electron optical system such as an electromagnetic lens is used, the distortion (distortion aberration) occurs as shown in FIG. 11A. A form of the distortion takes a distribution called a barrel shape or a pincushion shape depending on conditions. In general, the distortion of the magnetic lens deviates in a rotational direction in addition to a radial direction. FIG. 11A shows an example under a condition where no rotational component occurs. The direction of the distortion occurring in the multiple beams 20 and the position shift amount are different for each beam even if there is a certain tendency. Therefore, in order to correct the distortion, it is necessary to correct the distortion for each beam. The irradiation position 19 of the multiple beams 20 with which the substrate 101 is irradiated can be corrected as shown in FIG. 11B by correcting the beam orbit for each beam using the aberration corrector 220 in the first embodiment.

Figure 12A:
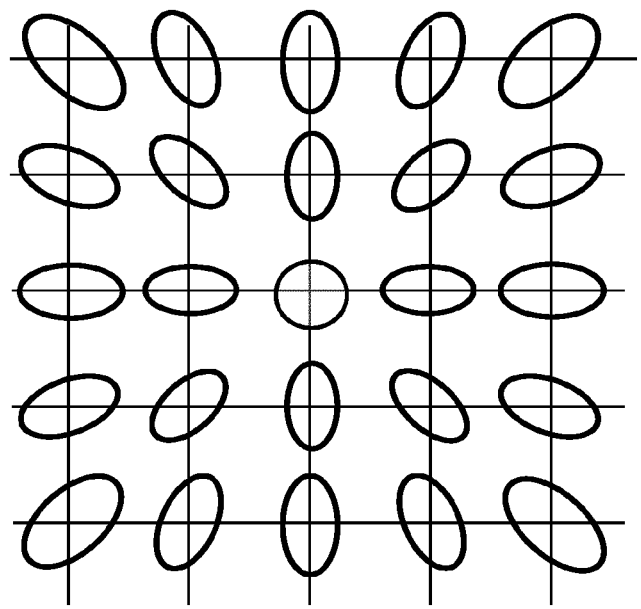
FIGS. 12A and 12B are diagrams showing an example of astigmatism in the first embodiment.
Figure 12B:
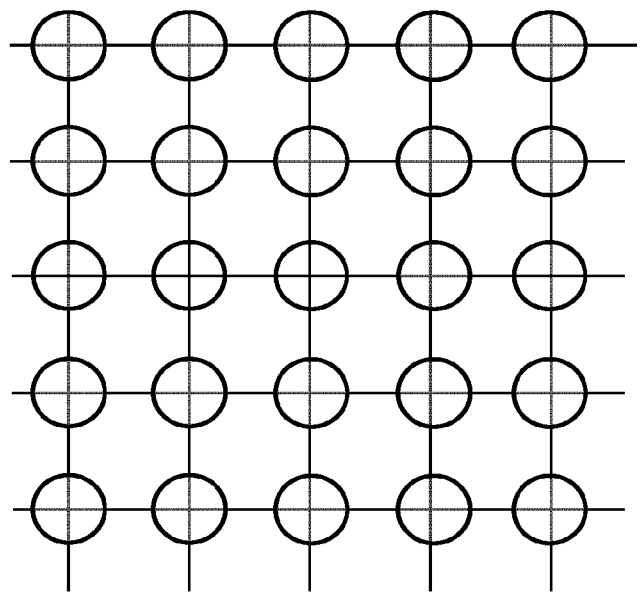

FIGS. 12A and 12B are diagrams showing an example of the astigmatism in the first embodiment. In the examples of FIGS. 12A and 12B, a case where 5×5 multiple beams 20 are used is shown. As shown in FIG. 12B, ideally, each beam is emitted in a circular shape. However, when an electron optical system such as an electromagnetic lens is used, the astigmatism may occur as shown in FIG. 12A. Therefore, as shown in FIG. 12A, the focal position is shifted in two-dimensional directions of the x and y directions on the substrate 101 (target object) surface, the beam becomes a so-called elliptical shape at the focal position, and blurring occurs in the emitted beam. The direction of the astigmatism occurring in the multiple beams 20 and the position shift amount tend to be elliptical so as to extend radially from the center of the multiple beams 20, but are different for each beam. Therefore, in order to correct the astigmatism, it is necessary to correct the astigmatism for each beam. Therefore, the astigmatism can be corrected as shown in FIG. 12B by correcting the beam orbit for each beam using the aberration corrector 220 in the first embodiment.

Figure 13A:
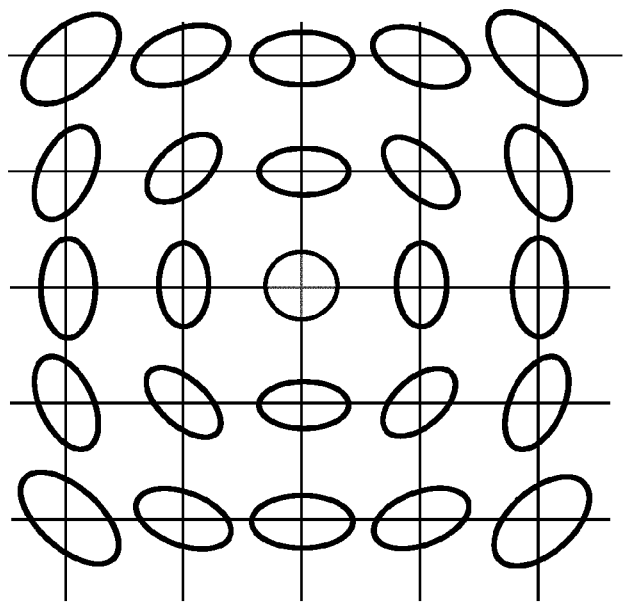
FIGS. 13A and 13B are diagrams showing another example of the astigmatism in the first embodiment.
Figure 13B:
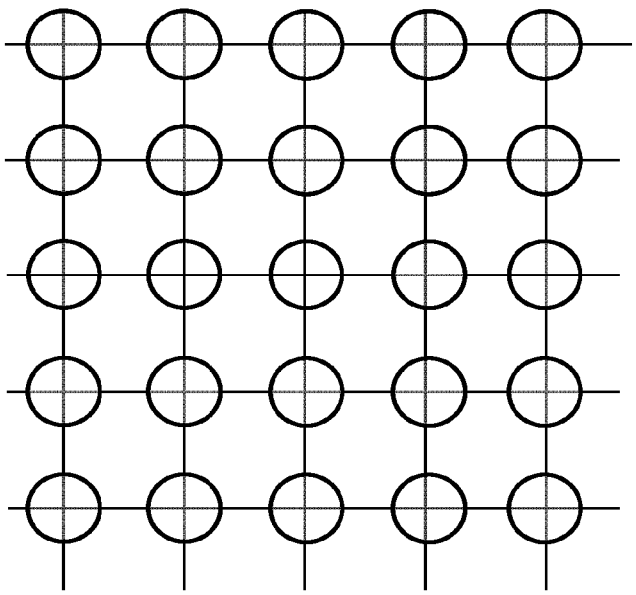

FIGS. 13A and 13B are diagrams showing another example of the astigmatism in the first embodiment. The direction of the astigmatism occurring in the multiple beams 20 is not limited to the case of extending radially from the center of the multiple beams 20 shown in FIG. 12A. As shown in FIG. 13A, a case of extending in a circumferential direction may also occur. Even in such a case, similarly, the astigmatism can be corrected as shown in FIG. 13B by correcting the beam orbit for each beam using the aberration corrector 220 in the first embodiment.

Further, in the aberration corrector 220 of the first embodiment, the distortion and the astigmatism can be corrected simultaneously.

Here, as shown in FIG. 7, in the electron beam deflected by the plurality of electrodes 16 of the second electrode substrate 14 and the electron beam deflected by the plurality of electrodes 26 of the third electrode substrate 24, since the arrangement height positions of the electrodes are different, the height position of the deflection fulcrum is shifted. It is preferable to control the potential applied to each electrode 16 (26) so as to correct an error due to a difference in the height of the deflection fulcrum. In addition, the focal position may be shifted due to the aberration correction. Therefore, it is preferable that the electrostatic lens array 221 individually corrects the focal position for each beam.

Here, the electrostatic lens array 221 has electrode substrates of three stages in which passage holes through which the multiple beams 20 pass are formed, and an annular electrode surrounding each passage hole capable of individually controlling the applied potential for each beam is disposed on the electrode substrate of the middle stage. Further, a GND potential is applied to the electrode substrates of the upper and lower stages. The focal position of each beam can be individually controlled by individually adjusting the potential applied to each annular electrode of the electrode substrate of the middle stage.

The image acquisition mechanism 150 acquires a secondary electron image of a pattern formed on the substrate 101 using the multiple beams 20 (multiple primary electron beams) in which at least one of the astigmatism and the distortion aberration has been corrected by the aberration corrector 220. Specifically, the following operation is performed.

Figure 14:
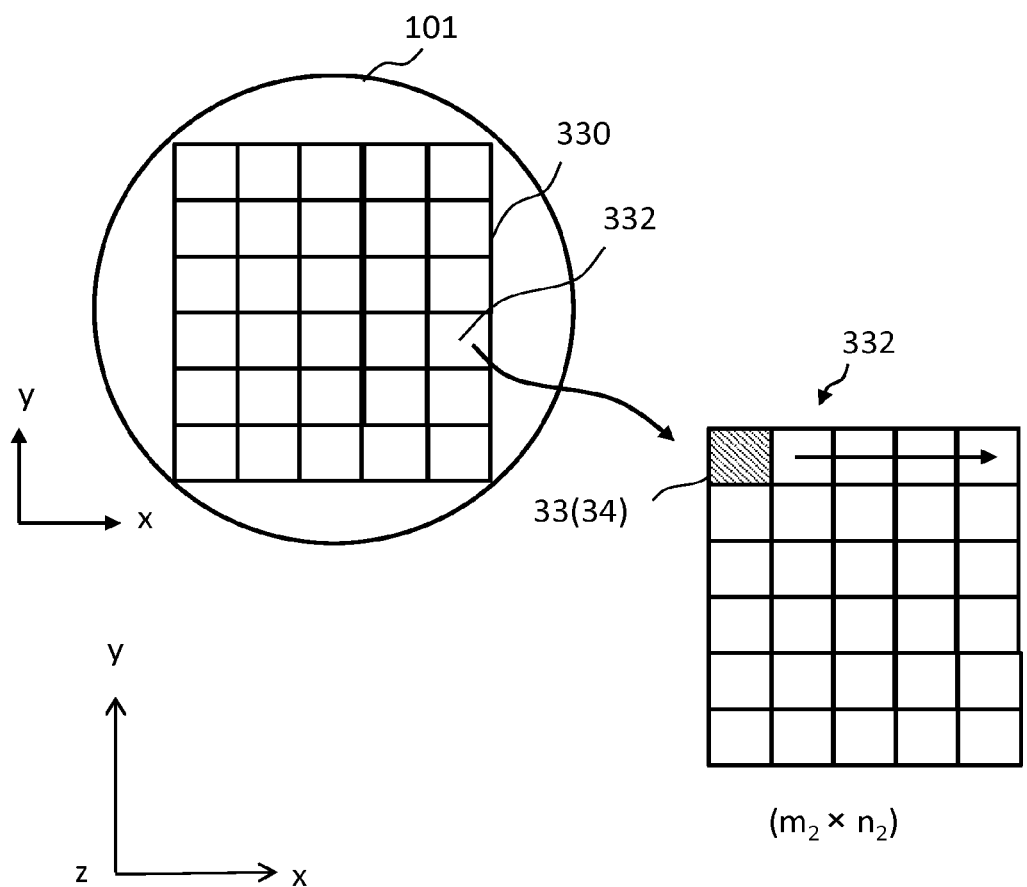
FIG. 14 is a diagram showing an example of a plurality of chip regions formed on a semiconductor substrate in the first embodiment.

FIG. 14 is a diagram showing an example of a plurality of chip regions formed on a semiconductor substrate in the first embodiment. In FIG. 14, when the substrate 101 is the semiconductor substrate (wafer), a plurality of chips (wafer dies) 332 are formed in a two-dimensional array in an inspection region 330 of the semiconductor substrate (wafer). In each chip 332, a mask pattern for one chip formed on the mask substrate for exposure is reduced to ¼ by an exposure device (stepper) not shown in the drawings and is transferred. An inner portion of each chip 332 is divided into $m_2 \times n_2$ ($m_2$ and $n_2$ are integers of 2 or more) mask dies 33 to be arranged two-dimensionally in a width direction (x direction) and a length direction (y direction). In the first embodiment, the mask die 33 becomes a unit inspection region. The movement of the beam to the target mask die 33 is performed by collective deflection of the entire multiple beams 20 by the main deflector 208.

Figure 15:
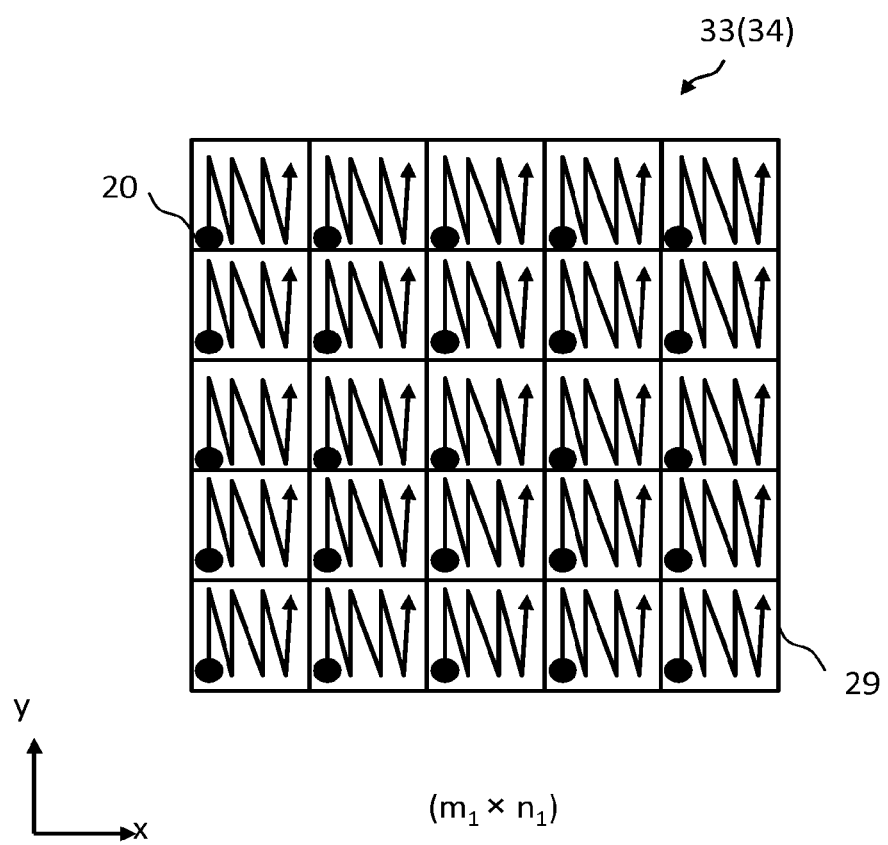
FIG. 15 is a diagram illustrating a scan operation of multiple beams in the first embodiment.

FIG. 15 is a diagram illustrating a scan operation of multiple beams in the first embodiment. In the example of FIG. 15, a case of multiple beams 20 of 5×5 rows is shown. An irradiation region 34 that can be irradiated with the beams with one irradiation of the multiple beams 20 is defined by (an x-direction size obtained by multiplying an inter-beam pitch in the x direction of the multiple beams 20 on the surface of the substrate 101 by the number of beams in the x direction)×(a y-direction size obtained by multiplying an inter-beam pitch in the y direction of the multiple beams 20 on the surface of the substrate 101 by the number of beams in the y direction). In the example of FIG. 15, the case where the irradiation region 34 has the same size as the mask die 33 is shown. However, the present invention is not limited thereto. The irradiation region 34 may be smaller than the mask die 33. Alternatively, the irradiation region 34 may be larger than the mask die 33. In addition, the inside of sub-irradiation regions 29 surrounded by the inter-beam pitch in the x direction and the inter-beam pitch in the y direction in which each beam is located is scanned with each beam of the multiple beams 20 (scan operation). Each beam configuring the multiple beams 20 is in charge of any one of the different sub-irradiation regions 29. At each shot, the same position in the assigned sub-irradiation region 29 is irradiated with each beam. The movement of the beam in the sub-irradiation region 29 is performed by collective deflection of the entire multiple beams 20 by the sub-deflector 209. The above operation is repeated and the inside of one sub-irradiation region 29 is sequentially irradiated with one beam.

The multiple secondary electron beams 300 including reflected electrons corresponding to the multiple beams 20 are emitted from the substrate 101 due to the irradiation of a desired position of the substrate 101 with the multiple beams 20 in which the aberration has been corrected by the aberration corrector 220. The multiple secondary electron beams 300 emitted from the substrate 101 travel to the beam separator 214 and are bent obliquely upward. The orbit of the multiple secondary electron beams 300 bent obliquely upward is bent by the deflector 218, and the multiple secondary electron beams 300 are projected onto the multi-detector 222. In this way, the multi-detector 222 detects the multiple secondary electron beams 300 emitted due to irradiation of the surface of the substrate 101 with the multiple beams 20. The reflected electrons may diverge in the middle of an optical path.

As described above, in the entire multiple beams 20, the mask die 33 is scanned as the irradiation region 34. However, one corresponding sub-irradiation region 29 is scanned with each beam. If scanning of one mask die 33 is completed, a next adjacent mask die 33 moves to become the irradiation region 34 and the next adjacent mask die 33 is scanned. This operation is repeated and scanning of each chip 332 is progressed. By each shot of the multiple beams 20, secondary electrons are emitted from the position irradiated with the beam and are detected by the multi-detector 222.

As described above, the image acquisition mechanism 150 scans the inspected substrate 101 on which the figure pattern has been formed by using the multiple beams 20 and detects the multiple secondary electron beams 300 emitted from the inspected substrate 101 due to irradiation of the multiple beams 20. Detection data of the secondary electrons (measurement image: secondary electron image: inspected image) from each measurement pixel 36 detected by the multi-detector 222 are output to the detection circuit 106 in order of measurement. In the detection circuit 106, analog detection data is converted into digital data by an A/D converter not shown in the drawings and is stored in the chip pattern memory 123. In this way, the image acquisition mechanism 150 acquires a measurement image of a pattern formed on the substrate 101. For example, when the detection data for one chip 332 is accumulated, the detection data is transferred to the comparison circuit 108 together with information showing each position from the position circuit 107 as chip pattern data.

As a reference image generation step, a reference circuit 112 (reference image generation unit) generates a reference image corresponding to the inspected image. The reference circuit 112 generates a reference image for each frame region, on the basis of design data to be a basis for forming the pattern on the substrate 101 or design pattern data defined in exposure image data of the pattern formed on the substrate 101. For example, it is preferable to use the mask die 33 as the frame region. Specifically, the following operation is performed. First, the design pattern data is read from the storage device 109 through the control computer 110 and each figure pattern defined in the read design pattern data is converted into binary or multi-valued image data.

Here, in the figure defined in the design pattern data is, for example, a rectangle or a triangle is used as a basic figure. For example, figure data in which a form, a size, a position, and the like of each pattern figure are defined by information such as the coordinates (x, y) at a reference position of the figure, a length of a side, and a figure code to be an identifier to distinguish a figure type such as the rectangle or the triangle is stored.

If the design pattern data to be the figure data is input to the reference circuit 112, the data is expanded into data of each figure and a figure code showing the figure shape of the figure data, a figure dimension, and the like are interpreted. In addition, the data is expanded into binary or multi-valued design pattern image data as a pattern disposed in a square with a grid of a predetermined quantization dimension as a unit and is output. In other words, the design data is read, an occupancy rate occupied by the figure in the design pattern is calculated for each square formed by virtually dividing the inspection region as a square with a predetermined dimension as a unit, and n-bit occupancy rate data is output. For example, it is preferable to set one square as one pixel. Assuming that one pixel has a resolution of $1/2^8$ (=$1/256$), a small region of $1/256$ is allocated by the region of the figure disposed in the pixel to calculate the occupancy rate in the pixel. In addition, the data is output to the reference circuit 112 as 8-bit occupancy rate data. The square (inspection pixel) may be matched with the pixel of the measurement data.

Next, the reference circuit 112 performs appropriate filter processing on the design image data of the design pattern to be image data of the figure. Since optical image data as the measurement image is in a state in which the filter is operated by an optical system, in other words, in an analog state which continuously changes, the filter processing is performed on the design image data in which the image intensity (gray value) is image data on the design side of a digital value, so that the data can be matched with the measurement data. The image data of the generated reference image is output to the comparison circuit 108.

Figure 16:
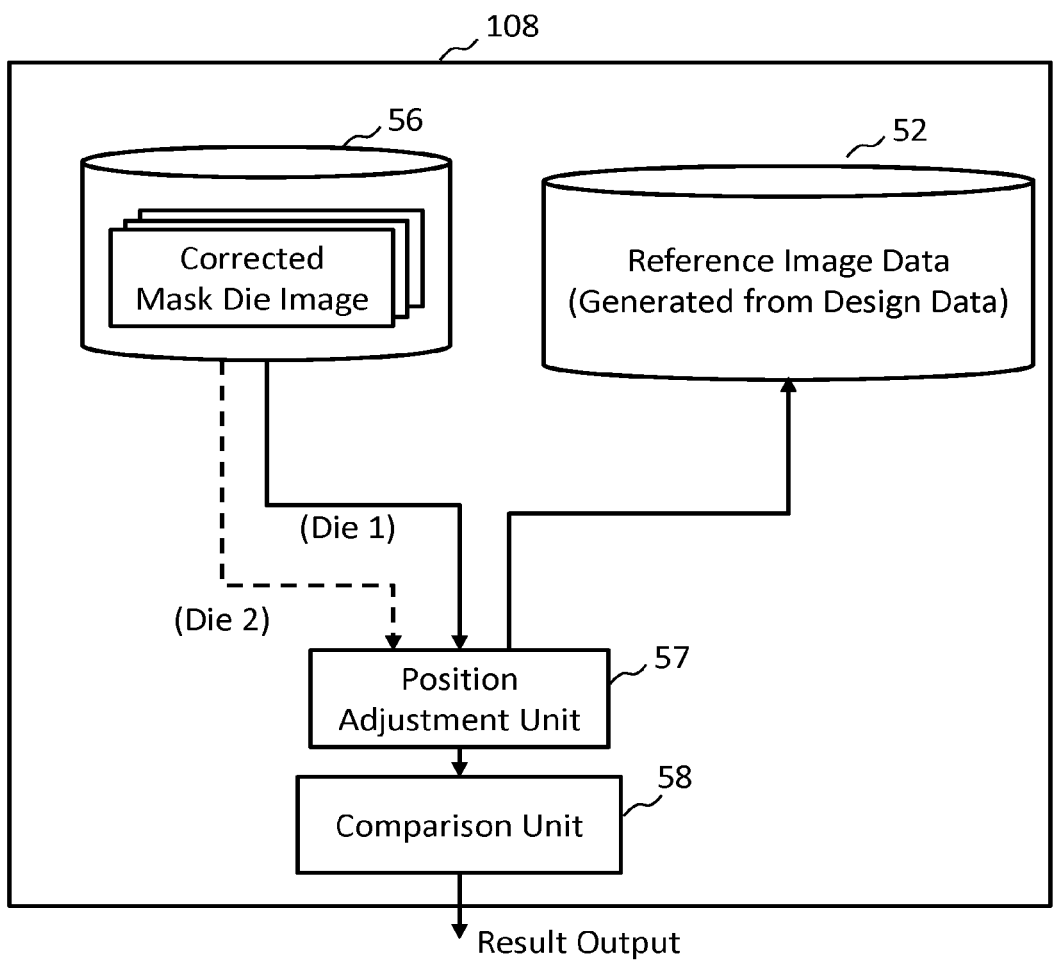
FIG. 16 is a configuration diagram showing an example of an internal configuration of a comparison circuit in the first embodiment.

FIG. 16 is a configuration diagram showing an example of an internal configuration of the comparison circuit in the first embodiment. In FIG. 16, storage devices 52 and 56 such as magnetic disk drives, a position adjustment unit 57, and a comparison unit 58 are disposed in the comparison circuit 108. Each "unit" such as the position adjustment unit 57 and the comparison unit 58 includes a processing circuit and an electric circuit, a computer, a processor, a circuit board, a quantum circuit, or a semiconductor device is included in the processing circuit. In addition, a common processing circuit (same processing circuit) may be used for each "unit". Alternatively, different processing circuits (separate processing circuit) may be used for "unit"s. Necessary input data or calculated results in the position adjustment unit 57 and the comparison unit 58 are stored in a memory not shown in the drawings or the memory 118 each time.

In the comparison circuit 108, the transferred pattern image data (secondary electronic image data) is temporarily stored in the storage device 56. Further, the transferred reference image data is temporarily stored in the storage device 52.

As a position adjustment step, the position adjustment unit 57 reads the mask die image to be the inspected image and the reference image corresponding to the mask die image and adjusts positions of both the images in a unit of a sub-pixel smaller than the pixel 36. For example, the position adjustment may be performed by a method of least squares.

As a comparison step, the comparison unit 58 compares the mask die image (inspected image) with the reference image. The comparison unit 58 compares both the images for each pixel 36 according to a predetermined determination condition and determines presence or absence of a defect such as a shape defect, for example. For example, when a gradation value difference for each pixel 36 is larger than a determination threshold Th, the defect is determined. In addition, a comparison result is output. The comparison result may be output to the storage device 109, the monitor 117, or the memory 118 or may be output from the printer 119.

Note that the present invention is not limited to the above-described die to database inspection, and a die to die inspection may be performed. When the die to die inspection is performed, images of the mask die 33 on which the same pattern has been formed may be compared with each other. Therefore, a mask die image of a partial region of a wafer die 332 to be a die (1) and a mask die image of a corresponding region of another wafer die 332 to be a die (2) are used. Alternatively, the mask die image of the partial region of the same wafer die 332 may be set as a mask die image of the die (1), the mask die image of another part of the same wafer die 332 on which the same pattern has been formed may be set as a mask die image of the die (2), and the comparison may be performed. In such a case, if one of the images of the mask die 33 on which the same pattern has been formed is used as a reference image, the inspection can be performed by the same method as the above-described die to database inspection.

That is, as the position adjustment step, the position adjustment unit 57 reads the mask die image of the die (1) and the mask die image of the die (2) and adjusts positions of both the images in a unit of a sub-pixel smaller than the pixel 36. For example, the position adjustment may be performed by a method of least squares.

As the comparison step, the comparison unit 58 compares the mask die image of the die (1) with the mask die image of the die (2). The comparison unit 58 compares both the images for each pixel 36 according to a predetermined determination condition and determines presence or absence of a defect such as a shape defect, for example. For example, when a gradation value difference for each pixel 36 is larger than a determination threshold Th, the defect is determined. In addition, a comparison result is output. The comparison result may be output to a storage device, a monitor, or a memory not shown in the drawings, or may be output from a printer.

Further, in the die to database inspection and the die to die inspection, in the above-described example, a case where comparison is performed for each pixel is shown, but the present invention is not limited thereto. For example, it is also preferable to extract contour lines of each figure pattern and determine that there is a defect when a distance between the contour lines exceeds a threshold.

As described above, according to the first embodiment, since the wiring space can be increased, a degree of freedom in wiring design can be increased. Therefore, multilayer wiring can be avoided, and wirings can be disposed in one layer. As a result, contact due to multilayering becomes unnecessary, and contact defects can be suppressed. Further, since complicated circuit formation is unnecessary due to the multilayering, disconnection of the wiring can be suppressed. Therefore, according to the first embodiment, wiring defects of the aberration corrector 220 in which the multipole lenses for the multiple electron beams are disposed in an array can be reduced or avoided.

Furthermore, the thickness of each electrode 16 of the multipole lenses disposed in an array for the multiple electron beams can be reduced. In addition, it is possible to suppress movement of electrons between passage holes for adjacent beams, and it is possible to suppress each electric field from being affected by the potential for the adjacent beam. Therefore, even when the inter-beam pitch P is narrow, sufficient performance can be exhibited as the aberration corrector 220.

Second Embodiment

In the first embodiment, a case where electrodes 16 and 26 are disposed on top surfaces of a second electrode substrate 14 and a third electrode substrate 24, respectively, has been described, but the present invention is not limited thereto. In a second embodiment, a configuration in which electrodes are disposed on both a top surface and a back surface of electrode substrates will be described. A configuration of an inspection apparatus 100 in the second embodiment is the same as that of FIG. 1. Further, contents other than points described below are the same as those in the first embodiment.

FIGS. 17A and 17B are top views showing an example of a configuration of each electrode substrate of an aberration corrector in the second embodiment.

Figure 18:
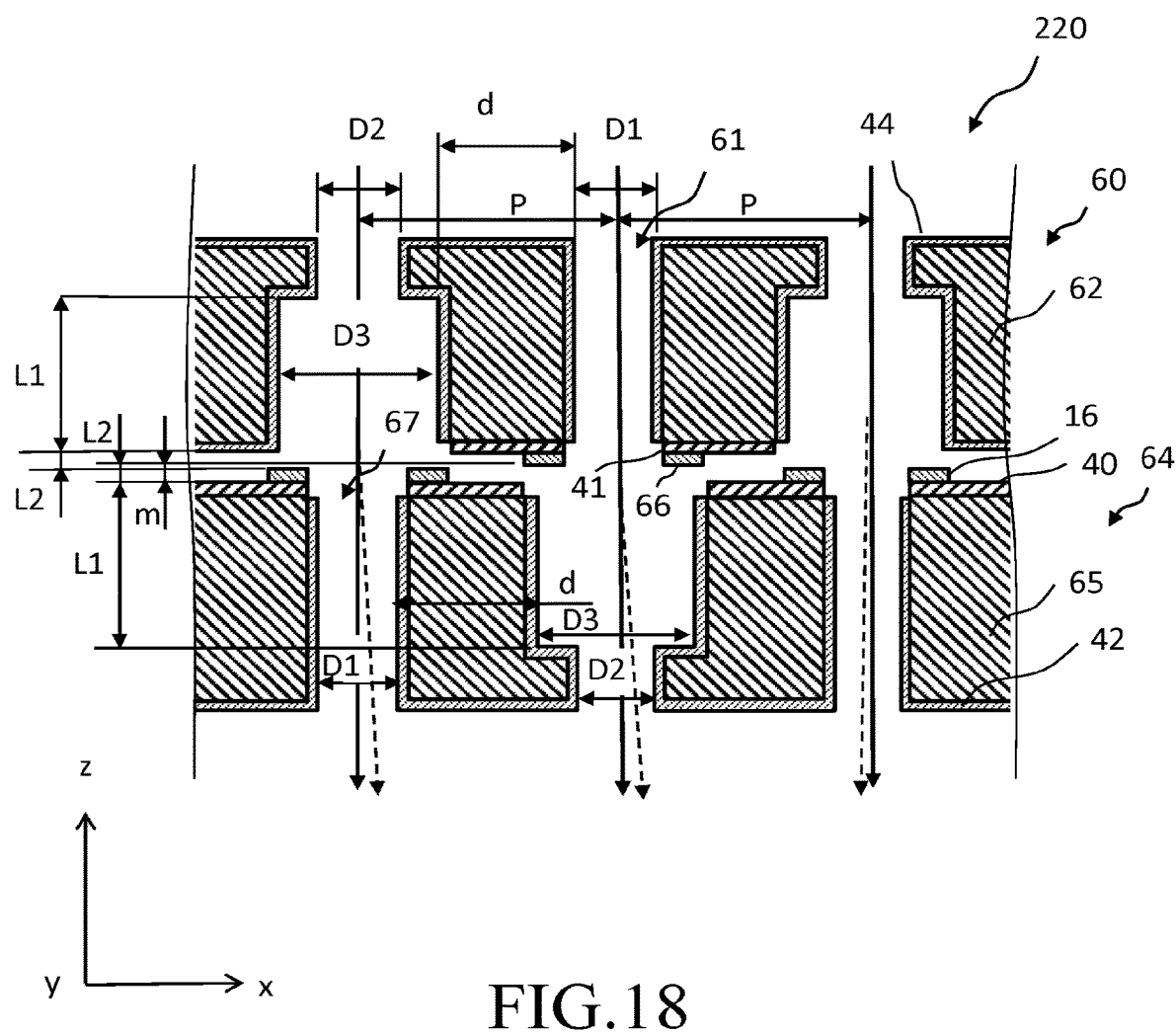
FIG. 18 is a cross-sectional view showing an example of a configuration of the aberration corrector in the second embodiment.

FIG. 18 is a cross-sectional view showing an example of a configuration of the aberration corrector in the second embodiment.

An aberration corrector 220 includes two or more stages of electrode substrates disposed with a predetermined gap. In the examples of FIGS. 17A, 17B, and 18, the aberration corrector 220 configured by a first electrode substrate 60 (another example of the first electrode substrate) and a second electrode substrate 64 (another example of the second electrode substrate) sequentially disposed from an upper stage, which are electrode substrates of two stages disposed with a gap L2 between the electrode substrates, is shown. In other words, the first electrode substrate 60 is disposed above the second electrode substrate 64 with the gap L2. Further, in the examples of FIGS. 17A and 17B, a case where 5×5 multiple beams 20 are used is shown. FIG. 18 shows a portion including a region through which some beams of the 5×5 multiple beams 20 pass.

In the first electrode substrate 60, a plurality of passage holes 61 (another example of the first passage holes) through which the multiple beams 20 pass are formed in a substrate body 62. As shown in FIGS. 17A and 18, in the first electrode substrate 60, the plurality of passage holes 61 are formed at positions through which the multiple beams 20 with the inter-beam pitch P pass. Among the plurality of passage holes 61 of the first electrode substrate 60, some passage holes 61 through which some beam arrays set in advance pass are formed to have a hole diameter D1 from a top surface to a back surface of the substrate body 62. A plurality of electrodes 66 (a to h) (another example of the first electrodes) to be multipoles of four or more poles are disposed individually on each back surface region of the back surface regions around some passage holes 61. The remaining passage holes 61 through which the remaining beam arrays among the multiple beams 20 pass are formed to have a hole diameter D2 (second hole diameter) from the top surface (upstream side in a beam travel direction) of the substrate body 62 to the middle toward the back surface of the substrate body 62, and increase in size to a hole diameter D3 (third hole diameter) from the middle to the back surface of the substrate body 62. Further, as shown in FIG. 18, a top surface, a side surface, and inner walls of the plurality of passage holes 61 of the substrate body 62 are covered with a shield electrode 44. The shield electrode 44 is disposed on at least the inner walls of the plurality of passage holes 61.

The second electrode substrate 64 is disposed below (the downstream side in the beam travel direction) the first electrode substrate 60. In the second electrode substrate 64, a plurality of passage holes 67 (another example of the second passage holes) through which the multiple beams 20 with the inter-beam pitch P pass are formed in a substrate body 65. As shown in FIGS. 17B and 18, among the plurality of passage holes 67 of the second electrode substrate 64, some passage holes 67 corresponding to the remaining passage holes 61 in which the plurality of electrodes 66 are not disposed are formed to have a hole diameter D1 from a top surface of the substrate body 65 to a back surface of the substrate body 65. A plurality of electrodes 16 (a to h) (another example of the second electrodes) of four or more poles are disposed individually on each top surface region of the top surface regions around some passage holes 67. The remaining passage holes 67 through which the remaining beam arrays among the multiple beams 20 pass are formed to have a hole diameter D3 from the top surface (upstream side in the beam travel direction) of the substrate body 65 to the middle toward the back surface of the substrate body 65, and decrease in size to a hole diameter D2 from the middle to the back surface of the second electrode substrate 64. Further, as shown in FIG. 18, a back surface, a side surface, and inner walls of the plurality of passage holes 67 of the substrate body 65 are covered with a shield electrode 42. The shield electrode 42 is disposed on at least the inner walls of the plurality of passage holes 67.

In other words, among the plurality of passage holes 61 of the first electrode substrate 60, the remaining passage holes 61 located above some passage holes 67 in which the plurality of electrodes 16 of the second electrode substrate 64 are disposed are formed to have the hole diameter D2 from the top surface of the first electrode substrate 60 to the middle toward the back surface of the first electrode substrate 60, and to have the hole diameter D3 larger than the hole diameter D1 and the hole diameter D2 from the middle to the back surface of the first electrode substrate 60. Similarly, among the plurality of passage holes 67 of the second electrode substrate 64, the remaining passage holes 67 located below some passage holes 61 in which the plurality of electrodes 66 of the first electrode substrate 60 are disposed are formed to have the hole diameter D3 from the top surface of the second electrode substrate 64 to the middle toward the back surface of the second electrode substrate 64, and to have the hole diameter D2 from the middle to the back surface of the second electrode substrate 64. Note that, the hole diameter D1 and the hole diameter D2 may have the same size or different sizes. In the example of FIG. 18, a case where the hole diameter D1 and the hole diameter D2 have the same size is shown.

As some passage holes 67 through which some beam arrays set in advance pass, in the examples of FIGS. 17A and 18, the plurality of electrodes 66 are disposed below the 13 passage holes 61 of the first electrode substrate 60 through which 13 beam arrays disposed every other in the x and y directions among the 5×5 multiple beams 20 pass. In the examples of FIGS. 17B and 18, the plurality of electrodes 16 are disposed on the 12 passage holes 67 of the second electrode substrate 64 through which the remaining 12 beam arrays among the 5×5 multiple beams 20 pass.

Further, a plurality of wirings 18 (first wirings) connected to the plurality of electrodes 66 are disposed without intersecting on the back surface of the same first electrode substrate 60 as the electrode substrate on which the plurality of electrodes 66 are disposed. Similarly to FIG. 5 in a case where the substrate of the second stage is replaced with the back surface of the substrate of the first stage, the wiring 18 for each electrode 66 (V1 to V8) replacing each electrode 16 extends to an outer peripheral portion of the substrate body 62 replacing the substrate body 15 on a bottom surface of an insulating layer 41, and is electrically connected to an aberration correction circuit 121 with a connector, a cable, and the like not shown in the drawings interposed therebetween. Since the number of electrodes disposed below the first electrode substrate 60 can be suppressed to about 50% of the number of electrodes required for the entire multiple beams 20, the number of wirings can also be suppressed to 50%, and the plurality of wirings 18 can be disposed in one layer without being multilayered.

Similarly, a plurality of wirings 28 (second wirings) connected to the plurality of electrodes 16 are disposed without intersecting on the same second electrode substrate 64 as the electrode substrate on which the plurality of electrodes 16 are disposed. Similarly to FIG. 6 in a case where the substrate of the third stage is replaced with the substrate of the second stage, the wiring 28 for each electrode 16 (V1 to V8) replacing each electrode 26 extends to an outer peripheral portion of the substrate body 65 replacing the substrate body 25 on an insulating layer 40, and is electrically connected to the aberration correction circuit 121 with a connector, a cable, and the like not shown in the drawings interposed therebetween. Since the number of electrodes disposed on the second electrode substrate 64 can be suppressed to about 50% of the number of electrodes required for the entire multiple beams 20, the plurality of wirings 28 can be disposed in one layer without being multilayered.

Further, in the aberration corrector 220 of the second embodiment, similarly to the first embodiment, relations of D3>D2, L1>L2, and d/L2 Th are satisfied. Furthermore, similarly to the first embodiment, L1>D3 is preferably satisfied.

As described above, according to the second embodiment, the same effects as those of the first embodiment are exhibited. Further, according to the second embodiment, the number of electrode substrates can be reduced as compared with the first embodiment. Furthermore, according to the second embodiment, since the deviation in the arrangement height of the electrodes 16 and 66 can be reduced as compared with the first embodiment, the deviation in the height position of a deflection fulcrum can be reduced.

Third Embodiment

In the first embodiment, a case where electrodes 16 and 26 are disposed on top surfaces of a second electrode substrate 14 and a third electrode substrate 24, respectively, has been described, but the present invention is not limited thereto. In a third embodiment, a configuration in which electrodes are disposed on both a top surface and a back surface of electrode substrates will be described as a configuration different from that of the second embodiment. A configuration of an inspection apparatus 100 in the third embodiment is the same as that of FIG. 1. Further, contents other than points described below are the same as those in the first embodiment.

FIGS. 19A and 19B are top views showing an example of a configuration of each of first and third electrode substrates of an aberration corrector in the third embodiment. In FIGS. 19A and 19B, a second electrode substrate 74 is not shown.

Figure 20:
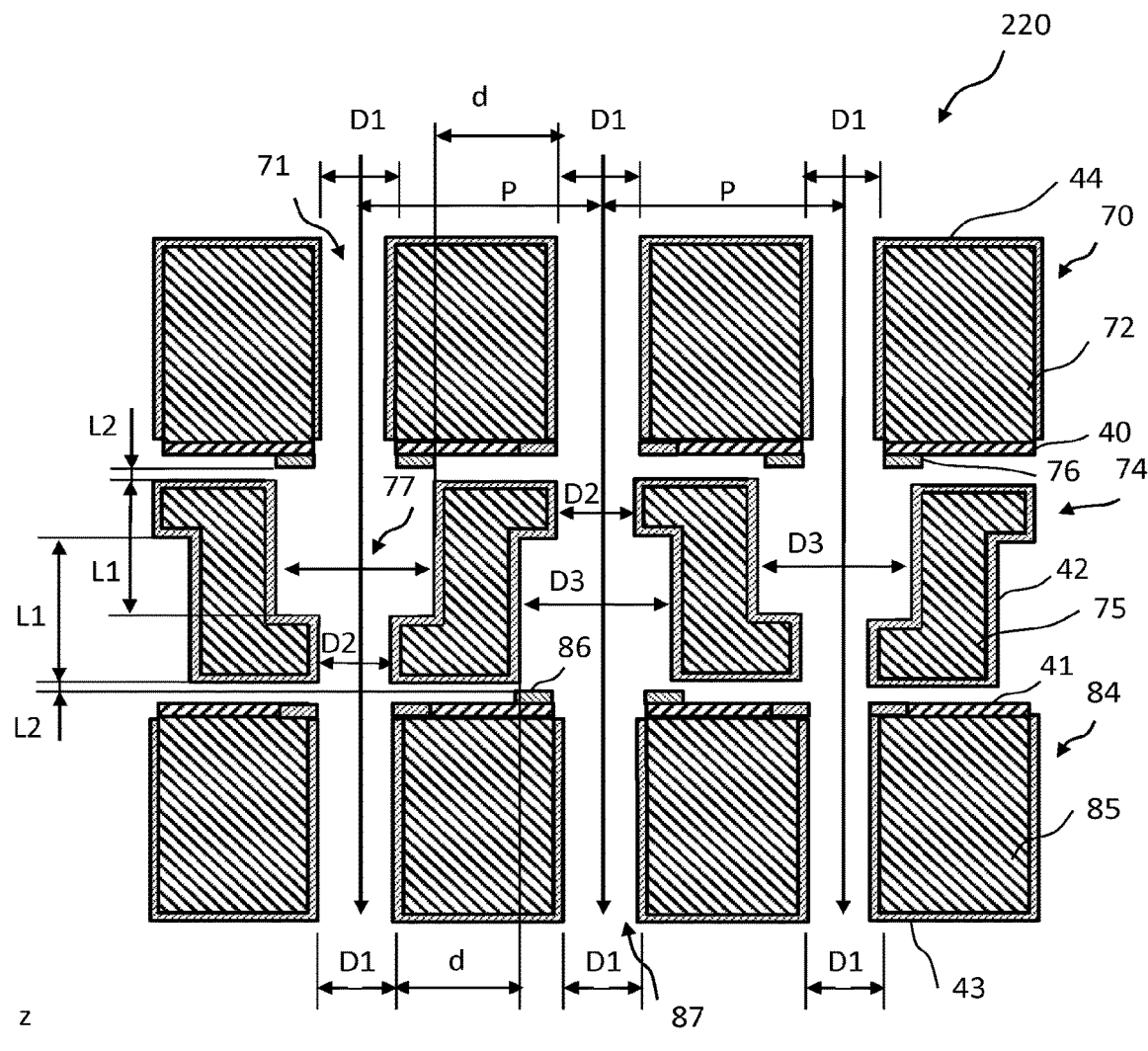
FIG. 20 is a cross-sectional view showing an example of a configuration of the aberration corrector in the third embodiment.

FIG. 20 is a cross-sectional view showing an example of a configuration of the aberration corrector in the third embodiment. An aberration corrector 220 includes three or more stages of electrode substrates disposed with a predetermined gap. In the example of FIG. 20, the aberration corrector 220 configured by a first electrode substrate 70, a second electrode substrate 74, and a third electrode substrate 84 sequentially disposed from an upper stage, which are electrode substrates of three stages disposed with a gap L2 between the electrode substrates, is shown. Further, in the examples of FIGS. 19A and 19B, a case where 5×5 multiple beams 20 are used is shown. FIG. 20 shows a portion including a region through which some beams of the 5×5 multiple beams 20 pass.

In the first electrode substrate 70, a plurality of passage holes 71 (another example of the first passage holes) through which the multiple beams 20 pass are formed in a substrate body 72. As shown in FIG. 20, in the first electrode substrate 70, the plurality of passage holes 71 are formed at positions through which the multiple beams 20 with the inter-beam pitch P pass. The plurality of passage holes 71 are formed to have a hole diameter D1 from a top surface (upstream side in a beam travel direction) to a back surface of the substrate body 72. A plurality of electrodes 76 (a to h) (another example of the first electrodes) to be multipoles of four or more poles are disposed individually for each passage hole 71 with an insulating layer 40 interposed therebetween on the back surface around some passage holes 71 through which some beam arrays set in advance pass, among the plurality of passage holes 71 of the first electrode substrate 70. Further, as shown in FIG. 20, a top surface, a side surface, and inner walls of the plurality of passage holes 71 of the substrate body 72 are covered with a shield electrode 44. The shield electrode 44 is disposed on at least the inner walls of the plurality of passage holes 71.

The second electrode substrate 74 is disposed below (the downstream side in the beam travel direction) the first electrode substrate 70. In the second electrode substrate 74, a plurality of passage holes 77 through which the multiple beams 20 with the inter-beam pitch P pass are formed in a substrate body 75. As shown in FIG. 20, among the plurality of passage holes 77 of the second electrode substrate 74, some passage holes 77 corresponding to some passage holes 71 in which the plurality of electrodes 76 are disposed are formed to have a hole diameter D3 from a top surface (upstream side in the beam travel direction) of the substrate body 75 to the middle toward a back surface of the substrate body 75, and decrease in size to a hole diameter D2 from the middle to the back surface of the second electrode substrate 74. Among the plurality of passage holes 77 of the second electrode substrate 74, the remaining passage holes 77 corresponding to the remaining passage holes 71 in which the plurality of electrodes 76 are not disposed are formed to have the hole diameter D2 from the top surface (upstream side in the beam travel direction) of the substrate body 75 to the middle toward the back surface of the substrate body 75, and increase in size to the hole diameter D3 from the middle to the back surface of the substrate body 75. Further, as shown in FIG. 20, a top surface, a back surface, a side surface, and inner walls of the plurality of passage holes 77 of the substrate body 75 are covered with a shield electrode 42. The shield electrode 42 is disposed on at least the inner walls of the plurality of passage holes 77.

In the third electrode substrate 84, a plurality of passage holes 87 through which the multiple beams 20 pass are formed in a substrate body 85. As shown in FIG. 20, in the third electrode substrate 84, a plurality of passage holes 87 are formed at positions through which the multiple beams 20 with the inter-beam pitch P pass. The plurality of passage holes 87 are formed to have a hole diameter D1 from a top surface (upstream side in the beam travel direction) of the substrate body 85 to a back surface of the substrate body 85. A plurality of electrodes 86 (a to h) (another example of the second electrodes) to be multipoles of four or more poles are disposed individually with an insulating layer 41 interposed therebetween on each top surface region of the top surface regions around some passage holes 87 corresponding to the remaining passage holes 71 in which the plurality of electrodes 76 are not disposed, among the plurality of passage holes 87 of the third electrode substrate 84. Further, as shown in FIG. 20, a bottom surface, a side surface, and inner walls of the plurality of passage holes 87 of the substrate body 85 are covered with a shield electrode 43. The shield electrode 43 is disposed on at least the inner walls of the plurality of passage holes 87.

Note that, the hole diameter D1 and the hole diameter D2 may have the same size or different sizes. In the example of FIG. 20, a case where the hole diameter D1 and the hole diameter D2 have the same size is shown.

Similarly to the above-described embodiment, as shown in FIG. 19A, the plurality of electrodes 76 are disposed below the 13 passage holes 71 of the first electrode substrate 70 through which 13 beam arrays arranged every other in x and y directions among the 5×5 multiple beams 20 pass. In addition, as shown in FIG. 19B, the plurality of electrodes 86 are disposed on the 12 passage holes 87 of the third electrode substrate 84 through which the remaining 12 beam arrays among the 5×5 multiple beams 20 pass.

Further, a plurality of wirings (first wirings) (not shown in the drawings) connected to the plurality of electrodes 76 are disposed without intersecting the back surface of the same first electrode substrate 70 as the electrode substrate on which the plurality of electrodes 76 are disposed. In addition, a wiring (not shown in the drawings) for each electrode 76 (V1 to V8) extends to an outer peripheral portion of the substrate body 72 on a bottom surface of the insulating layer 40, and is electrically connected to an aberration correction circuit 121 with a connector, a cable, and the like (not shown in the drawings) interposed therebetween. Since the number of electrodes disposed below the first electrode substrate 70 can be suppressed to about 50% of the number of electrodes required for the entire multiple beams 20, the number of wirings can also be suppressed to 50%, and a plurality of wirings (not shown in the drawings) can be disposed in one layer without being multilayered.

Likewise, a plurality of wirings (second wirings) (not shown in the drawings) connected to the plurality of electrodes 86 are disposed without intersecting the top surface of the same third electrode substrate 84 as the electrode substrate on which the plurality of electrodes 86 are disposed. In addition, a wiring for each electrode 86 (V1 to V8) extends to an outer peripheral portion of the substrate body 85 on the insulating layer 41, and is electrically connected to the aberration correction circuit 121 with a connector, a cable, and the like (not shown in the drawings) interposed therebetween. Since the number of electrodes disposed on the third electrode substrate 84 can be suppressed to about 50% of the number of electrodes required for the entire multiple beams 20, the plurality of wirings can be disposed in one layer without being multilayered.

Further, in the aberration corrector 220 of the third embodiment, similarly to the first embodiment, relations of D3>D2, L1>L2, and d/L2 Th are satisfied. Furthermore, similarly to the first embodiment, L1>D3 is preferably satisfied.

As described above, according to the third embodiment, the same effects as those of the first embodiment are exhibited. Further, according to the third embodiment, the number of electrode substrates in which the size of the passage hole changes on the way can be reduced.

In the above description, a series of "circuits" includes a processing circuit and an electric circuit, a computer, a processor, a circuit board, a quantum circuit, or a semiconductor device is included in the processing circuit. Further, a common processing circuit (same processing circuit) may be used for each "circuit". Alternatively, different processing circuits (separate processing circuit) may be used for "circuit"s. A program for executing a processor or the like may be recorded on a record carrier body such as a magnetic disk drive, a magnetic tape device, an FD, or a read only memory (ROM). For example, the position circuit 107, the comparison circuit 108, the reference image generation circuit 112, the stage control circuit 114, the aberration correction circuit 121, the lens control circuit 124, the blanking control circuit 126, and the deflection control circuit 128 may be configured by at least one processing circuit described above.

The embodiments have been described with reference to the specific examples. However, the present invention is not limited to these specific examples. In the example of FIG. 1, the case where the multiple beams 20 are formed by the shaping aperture array substrate 203 from one beam emitted from the electron gun assembly 201 to be one irradiation source is shown. However, the present invention is not limited thereto. The multiple beams 20 may be formed by emitting primary electron beams from a plurality of irradiation sources, respectively.

Further, in the example of FIG. 7, the insulating layers 40 and 41 are exposed around the top surfaces of the passage holes 17 and 27 where the electrodes 16 and 26 are not disposed, respectively. However, it is also preferable that conductive films are disposed in an exposed state around the passage holes 17 and 27 so as to surround the passage holes 17 and 27. The conductive films are connected to the shield electrodes 42 and 43. Similarly, the insulating layer 41 (40) is exposed around the bottom surface of the passage hole 61 (the top surface of the passage hole 67) where the electrode 66 (16) in FIG. 18 is not disposed. However, it is also preferable that a conductive film is disposed in an exposed state around the back surface of the passage hole 61 (top surface of the passage hole 67) so as to surround the passage hole (67). The conductive film is connected to the shield electrode 44 (42). Similarly, the insulating layer 40 (41) is exposed around the bottom surface of the passage hole 71 (the top surface of the passage hole 87) where the electrode 76 (86) in FIG. 20 is not disposed. However, it is also preferable that a conductive film is disposed in an exposed state around the back surface of the passage hole (top surface of the passage hole 87) so as to surround the passage hole 71 (87). The conductive film is connected to the shield electrode 44 (43).

Further, descriptions of parts and the like that are not directly necessary for explanation of the present invention, such as an apparatus configuration and a control method, have been omitted. However, the necessary apparatus configuration and control method can be appropriately selected and used.

In addition, all aberration correctors and multiple electron beam irradiation apparatuses that include the elements of the present invention and can be appropriately changed in design by those skilled in the art are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An aberration corrector comprising:
a first electrode substrate provided with a plurality of first passage holes through which multiple electron beams pass, a shield electrode being disposed on inner walls of the plurality of first passage holes;
a second electrode substrate disposed below the first electrode substrate and provided with a plurality of second passage holes through which the multiple electron beams pass, a shield electrode being disposed on inner walls of the plurality of second passage holes, a plurality of first electrodes of four or more poles being disposed individually on each top surface region of top surface regions around some second passage holes among the plurality of second passage holes; and
a third electrode substrate disposed below the second electrode substrate and provided with a plurality of third passage holes through which the multiple electron beams pass, a plurality of second electrodes of four or more poles being disposed individually on each of top surface region of top surface regions around some third passage holes corresponding to remaining second passage holes in which the plurality of first electrodes are not disposed, among the plurality of third passage holes, wherein
the some second passage holes in which the plurality of first electrodes are disposed are formed to have a first hole diameter, and some first passage holes located above the some second passage holes among the plurality of first passage holes of the first electrode substrate are formed to have a second hole diameter from a top surface of the first electrode substrate to a middle toward a back surface of the first electrode substrate and to have a third hole diameter larger than the first and second hole diameters from the middle to the back surface of the first electrode substrate, and
the some third passage holes in which the plurality of second electrodes are disposed are formed to have the first hole diameter, and remaining second passage holes located above the some third passage holes among the plurality of second passage holes of the second electrode substrate are formed to have the second hole diameter from a top surface of the second electrode substrate to a middle toward a back surface of the second electrode substrate and to have the third hole diameter larger than the first and second hole diameters from the middle to the back surface of the second electrode substrate.

2. The aberration corrector according to claim 1, wherein
a plurality of first wirings connected to the plurality of first electrodes are disposed without intersecting on a same electrode substrate as an electrode substrate on which the plurality of first electrodes are disposed, and
a plurality of second wirings connected to the plurality of second electrodes are disposed without intersecting on a same electrode substrate as an electrode substrate on which the plurality of second electrodes are disposed.

3. The aberration corrector according to claim 1, wherein a value obtained by dividing a distance between a portion formed to have the third hole diameter in a first passage hole of the some first passage holes and an adjacent first passage hole by a gap between the first and second electrode substrates is set to become equal to or larger than a threshold.

4. The aberration corrector according to claim 1, wherein the first and second electrode substrates are disposed such that a thickness of a portion where the some first passage holes are formed to have the third hole diameter in a thickness of the first electrode substrate is larger than a gap between the first and second electrode substrates.

5. The aberration corrector according to claim 1, wherein among the plurality of second passage holes, the some second passage holes in which the plurality of first electrodes are disposed and the remaining second passage holes in which the plurality of first electrodes are not disposed are alternately disposed.

6. An aberration corrector comprising:
a first electrode substrate provided with a plurality of first passage holes through which multiple electron beams pass, a plurality of first electrodes of four or more poles being disposed individually on each back surface region of back surface regions around some first passage holes among the plurality of first passage holes; and
a second electrode substrate disposed below the first electrode substrate and provided with a plurality of second passage holes through which the multiple electron beams pass, a plurality of second electrodes of four or more poles being disposed individually on each top surface region of top surface regions around some second passage holes corresponding to remaining first passage holes in which the plurality of first electrodes are not disposed, among the plurality of second passage holes.

7. The aberration corrector according to claim 6, wherein
the some second passage holes in which the plurality of second electrodes are disposed are formed to have a first hole diameter, and remaining first passage holes located above the some second passage holes among the plurality of first passage holes of the first electrode substrate are formed to have a second hole diameter from a top surface of the first electrode substrate to a middle toward a back surface of the first electrode substrate and to have a third hole diameter larger than the first and second hole diameters from the middle to the back surface of the first electrode substrate, and
the some first passage holes in which the plurality of first electrodes are disposed are formed to have the first hole diameter, and remaining second passage holes located below the some first passage holes among the plurality of second passage holes of the second electrode substrate are formed to have the third hole diameter from the top surface of the second electrode substrate to a middle toward the back surface of the second electrode substrate and to have the second hole diameter from the middle to the back surface of the second electrode substrate.

8. The aberration corrector according to claim 6, wherein
a plurality of first wirings connected to the plurality of first electrodes are disposed without intersecting on a same electrode substrate as an electrode substrate on which the plurality of first electrodes are disposed, and
a plurality of second wirings connected to the plurality of second electrodes are disposed without intersecting on a same electrode substrate as an electrode substrate on which the plurality of second electrodes are disposed.

9. The aberration corrector according to claim 6, further comprising:

a third electrode substrate disposed between the first and second electrode substrates and provided with a plurality of third passage holes through which the multiple electron beams pass, wherein the plurality of first passage holes are formed to have a first hole diameter, the remaining third passage holes located below remaining first passage holes in which the plurality of first electrodes are not disposed among the plurality of third passage holes are formed to have a second hole diameter from a top surface of the third electrode substrate to the middle toward a back surface of the third electrode substrate and to have a third hole diameter larger than the first and second hole diameters from the middle to the back surface of the third electrode substrate, and some third passage holes located below the some first passage holes in which the plurality of first electrodes are disposed among the plurality of third passage holes are formed to have the third hole diameter from the top surface of the third electrode substrate to the middle toward the back surface of the third electrode substrate and to have the second hole diameter from the middle to the back surface of the third electrode substrate.

10. The aberration corrector according to claim 6, wherein among the plurality of first passage holes, the some first passage holes in which the plurality of first electrodes are disposed and the remaining first passage holes in which the plurality of first electrodes are not disposed are alternately disposed.

* * * * *